(12) United States Patent
Chen et al.

(10) Patent No.: US 10,208,896 B2
(45) Date of Patent: Feb. 19, 2019

(54) LED LIGHTING DEVICE AND LAMP SHADE, AND CIRCUIT PREPARATION METHOD THEREOF

(71) Applicants: SHANGHAI SANSI ELECTRONIC ENGINEERING CO., LTD, Shanghai (CN); SHANGHAI SANSI SCIENCE AND TECHNOLOGY DEVELOPMENT CO., LTD, Shanghai (CN); JIASHAN SANSI PHOTOELECTRIC TECHNOLOGY CO., LTD, Jiaxing, Zhejiang (CN)

(72) Inventors: Bishou Chen, Shanghai (CN); Li Xu, Shanghai (CN); Peng Wang, Shanghai (CN); Xiaoliang He, Shanghai (CN); Sheng Li, Shanghai (CN); Haibo Liu, Shanghai (CN)

(73) Assignees: SHANGHAI SANSI ELECTRONIC ENGINEERING CO., LTD, Shanghai (CN); SHANGHAI SANSI SCIENCE AND TECHNOLOGY DEVELOPMENT CO., LTD, Shanghai (CN); JIASHAN SANSI PHOTOELECTRIC TECHNOLOGY CO., LTD, Jiaxing, Zhejiang (CN)

( * ) Notice: Subject to any disclaimer, the term of this patent is extended or adjusted under 35 U.S.C. 154(b) by 103 days.

(21) Appl. No.: 15/114,831

(22) PCT Filed: Jan. 27, 2015

(86) PCT No.: PCT/CN2015/071639
§ 371 (c)(1),
(2) Date: Jul. 27, 2016

(87) PCT Pub. No.: WO2015/110086
PCT Pub. Date: Jul. 30, 2015

(65) Prior Publication Data
US 2016/0341368 A1 Nov. 24, 2016

(30) Foreign Application Priority Data

Jan. 27, 2014 (CN) .......................... 2014 1 0040724
Jan. 27, 2014 (CN) .......................... 2014 1 0040726
May 8, 2014 (CN) .......................... 2014 1 0193097

(51) Int. Cl.
*F21K 9/232* (2016.01)
*F21V 29/85* (2015.01)
(Continued)

(52) U.S. Cl.
CPC ............ *F21K 9/232* (2016.08); *B05D 3/0254* (2013.01); *F21K 9/235* (2016.08); *F21K 9/237* (2016.08);
(Continued)

(58) Field of Classification Search
CPC .......... F21K 9/232; F21V 3/02; F21V 29/506; F21V 29/86; F21Y 2115/10
See application file for complete search history.

(56) References Cited

U.S. PATENT DOCUMENTS

2008/0284330 A1* 11/2008 Tachibana ................. F21K 9/00
313/506
2010/0026185 A1* 2/2010 Betsuda ................... F21V 29/02
315/32
(Continued)

FOREIGN PATENT DOCUMENTS

WO WO 2011124399 A1 * 10/2011 ................ F21V 5/00

OTHER PUBLICATIONS

English equivalent machine translation of WO 2011124399 A1, from European Patent Office, retrieved Jun. 12, 2018.*

*Primary Examiner* — Suezu Ellis

(57) ABSTRACT

An LED light device and a circuit preparation method thereof are provided. The LED light device includes a base, an LED light unit, and a lamp shade. The LED light-emitting
(Continued)

unit and the lamp shade are arranged on the base. The lamp shade covers the LED light-emitting unit inside. The circuit preparation method includes following steps of: providing a base which is a physical entity having a three-dimensional structure on the surface thereof; coating a circuit layer on the base surface through a programmable coating equipment, manual coating or the combined mode, wherein the circuit layer is a liquid or powder coating containing metal materials, and the thickness of the circuit layer is 20 μm or more; baking the base coated with the circuit layer at the high temperature of 100-1,000° C. until the circuit layer is dried; and obtaining a base having a three-dimensional circuit after cooling.

5 Claims, 18 Drawing Sheets

(51) Int. Cl.

| | |
|---|---|
| *F21V 29/506* | (2015.01) |
| *F21V 3/02* | (2006.01) |
| *F21V 23/00* | (2015.01) |
| *F21K 9/238* | (2016.01) |
| *F21K 9/235* | (2016.01) |
| *F21K 9/237* | (2016.01) |
| *B05D 3/02* | (2006.01) |
| *F21V 19/00* | (2006.01) |
| *F21V 3/10* | (2018.01) |
| *F21Y 113/00* | (2016.01) |
| *F21K 9/20* | (2016.01) |
| *F21V 29/74* | (2015.01) |
| *F21V 29/83* | (2015.01) |
| *F21Y 115/10* | (2016.01) |
| *F21V 17/10* | (2006.01) |
| *H05K 1/02* | (2006.01) |
| *H05K 1/09* | (2006.01) |
| *H05K 3/00* | (2006.01) |
| *F21V 3/06* | (2018.01) |

(52) U.S. Cl.
CPC ................ *F21K 9/238* (2016.08); *F21V 3/02* (2013.01); *F21V 3/10* (2018.02); *F21V 19/006* (2013.01); *F21V 23/00* (2013.01); *F21V 23/005* (2013.01); *F21V 29/506* (2015.01); *F21V 29/86* (2015.01); *F21K 9/20* (2016.08); *F21V 3/061* (2018.02); *F21V 17/101* (2013.01); *F21V 29/74* (2015.01); *F21V 29/83* (2015.01); *F21Y 2113/00* (2013.01); *F21Y 2115/10* (2016.08); *H05K 1/0284* (2013.01); *H05K 1/097* (2013.01); *H05K 3/0014* (2013.01); *H05K 2201/09018* (2013.01); *H05K 2201/09036* (2013.01); *H05K 2201/09045* (2013.01); *H05K 2201/0999* (2013.01); *H05K 2201/10106* (2013.01)

(56) References Cited

U.S. PATENT DOCUMENTS

| | | | | |
|---|---|---|---|---|
| 2010/0214781 | A1* | 8/2010 | Chiu | F21V 3/02 362/249.06 |
| 2010/0240158 | A1* | 9/2010 | Ter-Hovhannissian | H05K 1/053 438/27 |
| 2011/0095690 | A1* | 4/2011 | Sagal | B29C 45/14 315/113 |
| 2013/0027928 | A1* | 1/2013 | Kang | F21K 9/135 362/235 |
| 2014/0211468 | A1* | 7/2014 | Li | F21S 45/48 362/235 |

* cited by examiner

LED LIGHTING DEVICE AND LAMP SHADE, AND CIRCUIT PREPARATION METHOD THEREOF

CROSS REFERENCE OF RELATED APPLICATION

This is a U.S. National Stage under 35 U.S.C 371 of the International Application PCT/CN2015/071639, filed Jan. 27, 2015, which claims priority under 35 U.S.C. 119(a-d) to CN 201410040724.9, filed Jan. 27, 2014; CN 201410040726.8, filed Jan. 27, 2014 and CN 201410193097.2, filed May 8, 2014.

BACKGROUND OF THE PRESENT INVENTION

Field of Invention

The invention particularly relates to an LED lighting device and a lamp shade, and preparation method for its circuit.

Description of Related Arts

Chips used in LED (light emitting diode) lamps are required to be connected with circuits and then can be lighted up, but electrical circuits for lighting up the chips in the traditional LED lamps are realized through a circuit board. The circuit board is usually called PCB (printed circuit board). The manufactured PCB is mounted on a lamp base, and then the chips are welded at corresponding positions of the circuit board, thereby forming a prototype of the LED lamp. Unfortunately, the PCB is usually a flat plate, and all the circuits must be in one plane, which is bound to occupy a lot of space and is adverse to the design of some special lamp structures.

In the electronic assembly, the circuit boards are also a key part, and are equipped with other electronic components and connected with the circuits, to provide a stable circuit working environment. The most common circuit boards in application are planar PCBs usually painted with green paint. Copper plates are formed on both sides of a substrate by an electroplating way; the precise position of a circuit layer is determined by a photocopying and printing process; and then the excess copper is etched away and a layer of tin is welded on the surface of the circuit layer, thereby forming the circuit boards used in the daily production of people.

The existing circuit board production process has been very mature, but something unsatisfactory can be found everywhere. The waste liquid pollution generated by the electroplating way is serious. The purification treatment may generate high costs; many companies are driven by interests to discharge sewage wantonly, which may cause immeasurable harms to humans and the environment. On the other hand, for the considerations of positioning and efficiency, people commonly adopt the photocopying and printing process to determine the precise position of the circuit layer on the copper plate when the circuit layer of each circuit board is manufactured; and this process greatly limits the degrees of freedom of the circuit boards while bringing convenience, so that the whole circuit board has to be made into a two-dimensional flat plate, without showing any three-dimensional structure.

In view of this, people want to find a process method which is more environmentally friendly and capable of manufacturing a three-dimensional circuit to replace the process flow of the existing circuit boards.

SUMMARY OF THE PRESENT INVENTION

An object of this invention is to solve the above technical problems, and provide a preparation method for a coating type three-dimensional circuit and its application. The method of this invention can be used for directly manufacturing the complex three-dimensional circuit on the lamp base, so that the LED lamps do not need to depend on the circuit board, and the design of the lamps is free and diverse due to the three-dimensional circuit. This method is further promoted, so that the method for manufacturing the three-dimensional circuit according to the invention avoids the adverse effects of the traditional circuit board manufacturing process on the environment.

The object of the invention is realized by means of the following technical solution:

In a first aspect, the invention relates to a preparation method for a coating type three-dimensional circuit, wherein the method comprises steps of:

(A) providing a base, wherein the base is a physical entity having a three-dimensional structure on a surface of the base;

(B) coating a circuit layer on the surface of the base by using a programmable coating equipment, manual coating or a combined mode of using the programmable coating equipment and manual coating, wherein the circuit layer is a liquid or powder coating containing metal materials, and a thickness of the circuit layer is 20 μm or more;

(C) baking the base coated with the circuit layer at a high temperature of 100-1,000° C. until the circuit layer is dried; and (D) obtaining a base having the three-dimensional circuit after cooling.

Wherein the programmable coating equipment can be precisely positioned after programming, to draw a circuit layer pattern in fast dispensing or pressure extrusion way in accordance with wiring requirements. Part or all of the circuit layer pattern can be formed through manual painting. The above-mentioned high-temperature baking process contributes to a better consolidation of the circuit layer on the lamp base.

Preferably, the base is a columnar, massive, trumpet-shaped or truncated pyramid-shaped physical entity having the three-dimensional structure on the surface thereof.

Preferably, the three-dimensional structure is selected from a group consisting of boss, groove, arched projection and sinking structure.

Preferably, the base is made of a metal with an insulating material, a polymer material, heat-resistant plastic or ceramic.

Preferably, the base is a lamp base.

Preferably, the programmable coating equipment is capable of reading drawn CAD drawings to automatically draw the circuit layer pattern.

Preferably, the programmable coating equipment is capable of directly drawing the required circuit layer pattern through SCM programming.

Preferably, the programmable coating equipment is a dispenser.

Preferably, the dispenser comprises a dispensing device.

More preferably, the dispensing device has degrees of freedom in three directions of X, Y and Z.

More preferably, the dispensing device is able to smoothly move in a synthesis route of three dimensions of X, Y and Z.

Preferably, the circuit layer is metal slurry. The metal slurry has a certain viscosity, preferably silver paste.

Preferably, the cooling method is drying, air drying or instrument cooling.

In a second aspect, the invention relates to an LED bulb lamp without circuit board, comprising a bulb, light-emitting chips, a lamp base and a lamp holder, wherein the lamp base comprises a three-dimensional circuit; the three-dimensional circuit is a circuit layer coated on a surface of the lamp base through coating process, and a thickness of the circuit layer meets electrical indicators of the bulb lamp.

Preferably, the lamp base is a trumpet-shaped ceramic base having a three-dimensional structure on an upper surface thereof.

Preferably, the three-dimensional structure comprises a boss and an arched projection.

Preferably, the bulb is a transparent lamp shade.

Preferably, the light-emitting chips are welded on the lamp base.

Preferably, electrode pins of the light-emitting chips contact the circuit layer.

Preferably, the coating process is able to be achieved by using a programmable coating equipment, manual coating or a combined mode of using the programmable coating equipment and manual coating.

Preferably, the circuit layer is a conductive silver paste.

Preferably, the electrical indicators comprise a maximum voltage and a maximum current which are able to be borne by the circuit layer.

Preferably, the thickness of the circuit layer is 20 μm or more. Only if the thickness of the circuit layer is 20 μm or more, the electrical indicators of the bulb lamp are able to be met.

Preferably, a driving device is installed in the lamp holder.

In a third aspect, the invention relates to an electronic device without circuit board, comprising a substrate, an electronic component and a housing, wherein the substrate comprises a three-dimensional circuit; the three-dimensional circuit is a circuit layer coated on a surface of the substrate through coating process, and a thickness of the circuit layer meets electrical indicators of the electronic component.

Preferably, the substrate is a square ceramic substrate having a three-dimensional structure on the surface thereof.

Preferably, the three-dimensional structure is selected from a group consisting of a boss, a groove and a downwards arched structure.

Preferably, the electronic component is welded on the lamp base.

Preferably, electrode pins of the electronic component contact the circuit layer.

Preferably, the electronic component is selected from a group consisting of resistors, capacitors, inductors, diodes, triodes and integrated chips.

Preferably, the coating process is able to be achieved by using a programmable coating equipment, manual coating or a combined mode of using the programmable coating equipment and manual coating.

Preferably, the electrical indicators comprise a maximum voltage and a maximum current which are able to be borne by the circuit layer.

Preferably, the thickness of the circuit layer is 20 μm or more. Only if the thickness of the circuit layer is 20 μm or more, the electrical indicators of the electronic device are able to be met.

Preferably, the electronic device is encapsulated by a housing.

In a fourth aspect, the invention provides an LED lighting device, comprising: a base, an LED light-emitting unit and a lamp shade; wherein:

the LED light-emitting unit is arranged on an upper surface of the base; the lamp shade contacts with the base directly, and covers the LED light-emitting unit; the LED light-emitting unit comprises a plurality of LED light-emitting chips and a circuit coating; the circuit coating is directly coated on the upper surface of the base; the LED light-emitting chips are directly disposed on the upper surface of the base, and electrode pins of the light-emitting chips are electrically connected with the circuit coating;

the lamp shade has an outer surface and an inner surface; the outer surface is a light exit surface; the inner surface comprises a light distribution surface and a thermally-conductive surface, wherein, the light distribution surface is arranged on an inner surface region corresponding to the LED light-emitting chips; the light non-distribution surface is in clearance fit with the LED light-emitting chips, to form a light distribution chamber together with the upper surface of the base; the thermally-conductive surface is arranged on an inner surface part other than a part where the LED light-emitting chips are installed on the base, or an inner surface region corresponding to the entire upper surface, and closely fits with the base; and the thermally-conductive surface is at least distributed in a central region and an edge region of the inner surface.

Preferably, the central region covers 10-55% of a projected area of the entire inner surface.

Preferably, the inner surface of the lamp shade consists of the light distribution surface and the thermally-conductive surface.

Preferably, the lamp shade is made of transparent ceramic or glass.

Preferably, the transparent ceramic is selected from a group consisting of PLZT (Plomb Lanthanum Zirconate Titanate), $CaF_2$, $Y_2O_3$, YAG (yttrium aluminum garnet), polycrystalline AION and $MgAl_2O_4$.

Through repeated experiments, the inventors manufacture the lamp shade by using PC, glass and transparent ceramic respectively. The experimental results show that the junction temperature rise of PC is maximum; the junction temperature rise of the glass lens is significantly lower than that of PC, and the junction temperature rise of transparent ceramic lens is lower than that of glass. Therefore, the invention adopts the ceramic and glass with better thermal conductivity and lower junction temperature rise in use.

Preferably, the LED light-emitting unit further comprises a circuit board; the LED light-emitting chips are disposed on the circuit board, and the circuit board is disposed on the base.

Preferably, the circuit coating is a liquid or powder coating containing metal material; a thickness of a circuit layer of the circuit coating is 20 μm or above.

Preferably, the metal material of the circuit coating is selected from a group consisting of molybdenum, manganese, tungsten, silver, gold, platinum, silver-palladium alloy, copper, aluminum and tin material.

Preferably, the upper surface of the base is flat, curved, or in a shape of multi-planar combination.

Preferably, the outer surface of the lamp shade is made into specific curved shape in accordance with requirements of light distribution; the inner surface in contact with the base is a curved shape corresponding to the upper surface of the base.

Preferably, the base has a first cooling hole.

Preferably, the lamp shade has a second cooling hole, wherein, the second cooling hole is correspondingly communicated with the first cooling hole.

Preferably, the base is a metal base coated with an insulating layer, or a base made of an insulating material.

Preferably, the base has a hollow structure; the first cooling hole on the base is communicated with an outside air through a side of the base.

Preferably, the base has a non-hollow structure; cooling fins are arranged on an outer surface of the base.

Preferably, the device further comprises a power supply chamber, wherein the power supply chamber is not communicated with the base, namely, a cavity of the power supply chamber is isolated from the base. An outer housing of the power supply chamber is connected to the base in inserting, clamping and screwing modes, to realize independent cooling, so as to reduce the influence of heat generated by chips, and enhance the overall thermal capacity of the entire LED lighting device.

According to the LED lamp shade of this invention, the surface of the lamp shade comprises the outer surface and the inner surface; the outer surface is the light exit surface; the inner surface comprises the light distribution surface and the thermally-conductive surface, wherein the light distribution surface is the light incidence surface, and the thermally-conductive surface is at least distributed in the central region of the inner surface.

Preferably, the central region covers 10-55% of a projected area of the entire inner surface, and the LED lamp shade is made of thermally-conductive and transparent materials.

Preferably, the thermally-conductive surface is also distributed in the edge region of the inner surface.

Preferably, the LED lamp shade is made of transparent ceramic, glass or plastic.

Preferably, the transparent ceramic is selected from a group consisting of PLZT, $CaF_2$, $Y_2O_3$, YAG, polycrystalline AION and $MgAl_2O_4$.

An LED lighting device according to the invention, comprising the above-mentioned lamp shade, further comprising a base and an LED light-emitting unit, wherein the LED light-emitting unit is arranged on an upper surface of the base; the lamp shade is in direct contact with the base, and covers the LED light-emitting unit; the light distribution surface and the upper surface of the base form a light distribution chamber accommodating the LED light-emitting unit; the thermally-conductive surface closely fits with the upper surface of the base, to compose a heat flow path.

Preferably, a specific structure of the LED light-emitting unit is any of the following structures:

(1) The LED light-emitting unit comprises a plurality of LED light-emitting chips and a circuit board; the LED light-emitting chips are disposed on the circuit board, and the circuit board is disposed on the base; or (2) The LED light-emitting unit comprises a plurality of LED light-emitting chips and a circuit coating; the circuit coating is directly coated on the upper surface of the base; the LED light-emitting chips are directly disposed on the upper surface of the base, and electrode pins of the light-emitting chips are electrically connected with the circuit coating.

Preferably, the circuit coating is metal slurry.

Preferably, the upper surface of the base is flat, curved, or in a shape of multi-planar combination.

Preferably, the base has a first cooling hole; the LED lamp shade has a second cooling hole; the second cooling hole is correspondingly communicated with the first cooling hole.

Preferably, the base is a metal base coated with an insulating layer, or a base made of an insulating material.

Preferably, a structure of the base is any of the following structures:

(1) The base has a hollow structure; the first cooling hole on the base is communicated with an outside air through a side of the base; or (2) The base has a non-hollow structure; cooling fins are arranged on an outer surface of the base.

Preferably, the device further comprises a power supply chamber, wherein an outer housing of the power supply chamber is connected to the base; and a cavity of the power supply chamber is isolated from the base.

Compared with the prior art, the invention has the following beneficial effects:

The invention abandons the use of the circuit board, so that the structure of the LED lamp is further simplified, meanwhile, the purpose of directly manufacturing three-dimensional circuit on the lamp base is reached. On this basis, the invention further provides a manufacturing method of a three-dimensional circuit, which is more environmentally friendly than the traditional process.

The material having better thermal conductivity is employed as the lamp shade, as a result, heat generated by the chips not only can be dissipated via the base, but also can be transferred outwards via the thermally-conductive surface which is directly adhered to the base and arranged on the inner surface of the lamp shade. The thermally-conductive surface of the lamp shade is distributed in the central region and the edge region of the inner surface, so compared with the prior art only having the edge contact, a contact area between the lamp shade and the base is increased, thereby improving the heat dissipation function of the lamp shade. Inventors of the invention make calculations by computer thermal-simulation software. According to the invention, compared with existing products having the materials, sizes and powers same as those of the LED lighting device of the invention and only having edge contact, the junction temperature rise is reduced significantly and can be reduced by at least 30° C. Meanwhile, the experimental results obtained by the inventors through repeated experimental verification completely conform to the results simulated by the computer thermal-simulation software.

Inventors of the invention make calculations by computer thermal-simulation software. When the area ratio of the central region of the thermally-conductive surface to the projected area of the inner surface is in the range of 10-55%, the calculated junction temperature rise decreases obviously and linearly; when the area ratio is less than 10% or greater than 55%, the junction temperature rise changes slightly. As shown in FIG. 18, the horizontal axis represents the ratio of the central region occupying the projected area of the inner surface, and the vertical axis represents the junction temperature.

In addition, some preferred structures of the invention, such as the cooling hole and hollow base, can further enhance the heat dissipation function, thus allowing the entire device to dissipate heat in all directions, greatly improving the heat dissipation performance of the device, and prolonging the service life of the device. An independently arranged power supply chamber allows the heat generated by the chips and a power supply to be dissipated outwards by different structures respectively, thereby reducing the impact on the power supply caused by the heat generated by the chips, and further reducing the impact on the power supply caused by excessive heat.

Further, due to the improvement of the heat dissipation performance, the lighting device of higher power can be manufactured without increasing the size of the device, and the lighting brightness of the device is improved, while the use range and flexibility of the LED lighting device are improved in life and industrial use.

BRIEF DESCRIPTION OF THE DRAWINGS

Other features, objects, and advantages of the invention will become more apparent from reading the description of non-limiting embodiments detailed with reference to the following figures:

FIG. 2-1 is an overall structure diagram of an LED lighting device in Embodiment 4 of the invention;

FIG. 2-2 is a cross-sectional structure of the LED lighting device in FIG. 2-1;

FIG. 2-3 is an overall structure diagram of an LED lighting device in Embodiment 5 of the invention;

FIG. 2-4 is a cross-sectional structure of the LED lighting device in FIG. 2-3;

FIG. 2-5 is an overall structure diagram of the LED lighting device in Embodiment 5 of the invention;

FIG. 2-6 is a cross-sectional structure of the LED lighting device in FIG. 2-5;

FIG. 2-7 is an assembly diagram of an LED lighting device in Embodiment 7 of the invention;

FIG. 2-8 is a structure diagram of light-emitting units of the LED lighting device in to Embodiment 7 of the invention;

FIG. 2-9 is an overall structure diagram of the LED lighting device in Embodiment 7 of the invention;

FIG. 2-10 is an overall structure diagram of an LED lighting device in Embodiment 8 of the invention.

FIG. 2-11 is a cross-sectional structure of the LED lighting device in FIG. 2-10.

FIG. 2-12 is an overall structure diagram of an LED lighting device in Embodiment 9 of the invention;

FIG. 2-13 is a cross-sectional structure of the LED lighting device in FIG. 2-12;

FIG. 2-14 is a detailed distribution diagram of a light distribution surface 2-31 and a thermally-conductive surface 2-32 of a lamp shade 2-3 as shown in FIG. 2-2.

FIG. 2-15 is a detailed distribution diagram of the light distribution surface 2-31 and the thermally-conductive surface 2-32 of a lamp shade 2-3 as shown in FIG. 2-4.

FIG. 2-16 is a detailed distribution diagram of the light distribution surface 2-31 and the thermally-conductive surface 2-32 of a lamp shade 2-3 as shown in FIG. 2-6.

FIG. 2-17 is a detailed distribution diagram of the light distribution surface and thermally-conductive surface of a lamp shade as shown in FIG. 2-12.

FIG. 2-18 is curve diagram of cooling results of the LED lamp shade simulated by computer;

FIG. 2-19 is an overall structure diagram of the LED lighting device in Embodiment 10 of the invention;

FIG. 2-20 is a cross-sectional structure of the LED lighting device in FIG. 2-19;

Wherein, 1 is the first lamp base; 2 is the first conductive silver paste; 3 is the second conductive silver paste; 4 is the first boss; 5 is the square groove; 6 is the bulb; 7 is the third conductive silver paste; 8 is the light-emitting chip; 9 is the second boss; 10 is the arched projection; 11 is the electrical cable; 12 is the second lamp base; 13 is the lamp holder; 14 is the plate; 15 is the first circuit layer; 16 is the first device; 17 is the second device; 18 is the welding point; 19 is the substrate; 20 is the circular groove; 21 is the third boss; 22 is the downwards arched structure; 23 is the second circuit layer; 24 is the first component; 25 is the second component; 26 is the outer housing; 2-1 is the base; 2-2 is the LED light-emitting chip; 2-3 is the lamp shade; 2-31 is the light distribution surface; 2-32 is the thermally-conductive surface; 2-4 is the circuit board; 2-5 is the power supply chamber; 2-6 is the light-emitting module; 2-7 is the framework; 2-81 is the first cooling hole; 2-82 is the second cooling hole; and 2-9 is the cooling fin.

DETAILED DESCRIPTION OF THE PREFERRED EMBODIMENT

The invention will be described in detail with reference to specific embodiments and drawings. The following embodiments will help provide further understanding of the invention for those skilled in the art, and not in any way limit the invention. It shall be noted that several variants and improvements can be made without departing from concept of the invention for those of ordinary skill in the art. All these fall within the protection scope of the invention.

Embodiment 1

The embodiment relates to a preparation method for a coating type three-dimensional circuit and its application in a lamp base without circuit board. In the embodiment, according to the preparation method of the invention, a three-dimensional circuit is manufactured on a first lamp base 1 having a three-dimensional structure on a surface of the base 1. The specific embodiment and process are as shown in FIGS. 1-3.

Figure 1:
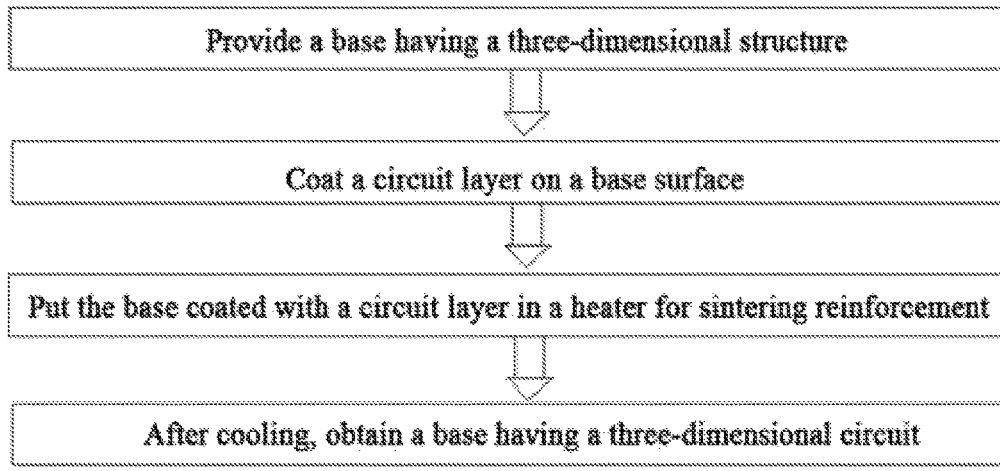
FIG. 1 is a step block diagram of a specific embodiment of the process of the invention.

FIG. 1 shows a flow block diagram of a process for manufacturing the three-dimensional circuit according to the invention. It can be seen that the manufacturing method comprises the following four steps of: firstly, providing a base with a certain three-dimensional structure, wherein the shape and the material of the base are unspecified; secondly, coating the circuit layer on the surface of the base according to a pre-designed or conceived circuit diagram; then, placing the base coated with the circuit layer into a heater for sintering reinforcement; and finally, cooling and obtaining the base, wherein the base has a three-dimensional circuit.

Figure 2:
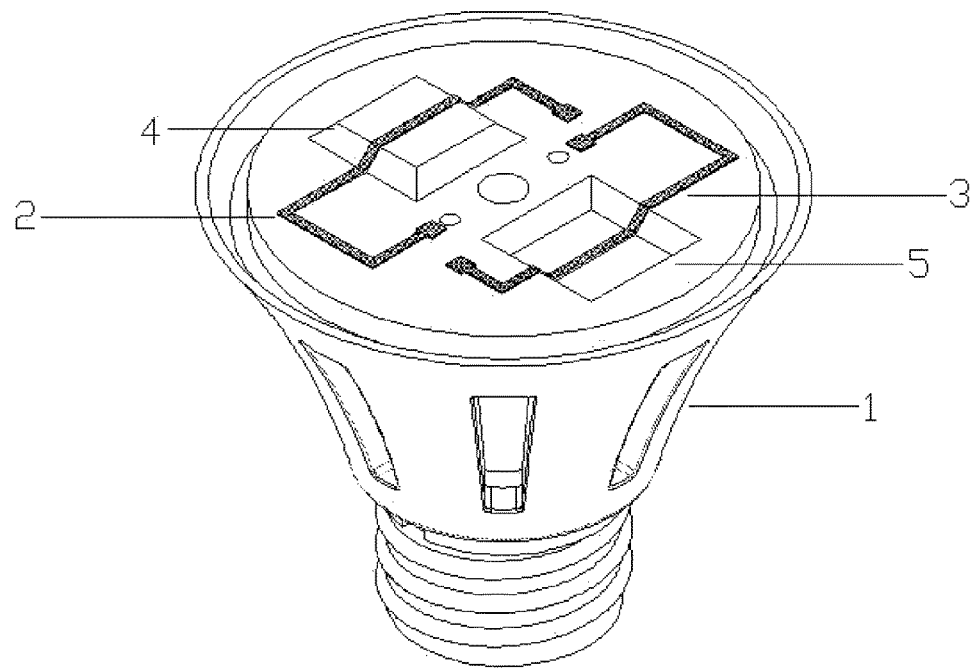
FIG. 2 is a structure diagram of a lamp base having a three-dimensional circuit manufactured by using the process according to the invention in Embodiment 1.
Figure 3:
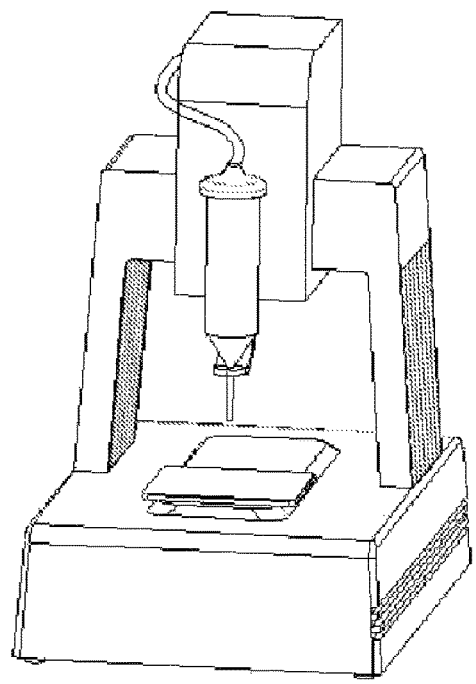
FIG. 3 is a schematic diagram of a dispenser used in the process for manufacturing the lamp base in Embodiment 1.

FIG. 2 shows a structure diagram of the lamp base having the three-dimensional circuit manufactured by using the process of the invention. The manufacturing steps are as follows: (1) providing a first lamp base 1, wherein the surface of the first lamp base 1 has a three-dimensional structure; (2) operating a dispenser to coat a first conductive silver paste 2 on the surface of the first lamp base 1 according to programs prepared by an SCM (Single Chip Microcomputer); dipping a second conductive silver paste manually, coating the second conductive silver paste 3 on the surface of the base 1 with a brush; (3) putting the first lamp base 1 coated with the first conductive silver paste 2 and the second conductive silver paste 3 in a high temperature furnace, baking, and taking out the lamp base after drying the first conductive silver paste 2 and the second conductive silver paste 3; and (4) putting the obtained first lamp base 1 in the shade to dry naturally, wherein the first lamp base 1 has the three-dimensional circuit.

It can be seen from FIG. 2 that the first lamp base 1 is not provided with the circuit board, and the surface is not a plane, but has a certain three-dimensional structure. The three-dimensional structure specifically comprises a first boss 4 and a square groove 5. The first lamp base 1 is integrally trumpet-shaped, made of heat-resistant plastic materials, and has a good thermal conductivity. The first lamp base 1 may also be made of other materials with good thermal conductivity, such as ceramic or polymer materials. The circuit layer is coated on the surface of the first lamp base 1 in mechanical and manual ways. The circuit layer comprises the first conductive silver paste 2 and the second conductive silver paste 3, and may also be replaced by other liquid or powder coatings containing metal components, such as soldering tin. The first conductive paste 2 is coated by the dispenser, covers the upper surface of the lamp base 1 and partially passes through the first boss 4; and the second conductive paste 3 is dipped by technical personnel with the brush and then coated on the first lamp base 1, and partially passes through the square groove 5. The thicknesses of the first conductive silver paste 2 and the second conductive silver paste 3 are 20 µm or more, preferably 50 µm. The thickness is adjusted by a built-in system of the dispenser; in the embodiment, the thickness of the first conductive silver paste 2 is determined to be 50 µm to meet requirements of electrical parameters required by a manufactured lamp. The electrical parameters comprise resistance, voltage, and current. When the thicknesses of the first conductive silver paste 2 and the second conductive silver paste 3 are less than 20 µm, it may be hard to bear the voltage applied thereon, and the excessive current passing through the first conductive silver paste 2 and the second conductive silver paste 3 may burn out the circuit. The dispenser coats the first conductive silver paste 2 on the first lamp base 1 by a pressure extrusion way. The dispenser comprises a dispensing device; the conductive silver paste is extruded from a needle tube by the dispensing device under an internal pressure, and smoothly moves on a prepared path, to complete the coating of the first conductive silver paste 2. The first lamp base 1 coated with the circuit layer is placed in the high temperature furnace for about 1.5 hours, and is baked by controlling the temperature at about 600° C.; and the heating is stopped after the circuit layer is dried. The baking lasted for one hour at this temperature can greatly improve the adhesive force of the first conductive silver paste 2 and the second conductive silver paste 3, so that the circuit layer is tightly sintered on the first lamp base 1. When the temperature is below 100° C., it is hard to achieve the purpose of heating; when the temperature is too high, above 1000° C., it is likely to burn out the first lamp base 1. The first lamp base 1 is taken out and dried naturally, and the first lamp base 1 has the three-dimensional circuit.

FIG. 3 shows a structure diagram of the dispenser used in the process for manufacturing the lamp base 1 as shown in FIG. 2 through the process of the invention. The dispenser is produced by SHENZHEN CITY Linden High Tech Co., LTD., CHINA, and has a model of SD300. The dispenser can dispense according to a drawn CAD drawing, can also dispense through the programs prepared by the SCM, which positions accurately. It also has a function of high-frequency dispensing. The dispensing device of the dispenser can be filled with slurry having a certain viscosity for dispensing. The dispenser also has an advanced control system which can control the pressure, dispensing speed and dispense volume of the dispensing device as required.

Embodiment 2

The embodiment relates to the application of the preparation method for the coating type three-dimensional circuit on an LED bulb lamp without circuit board.

Figure 4:
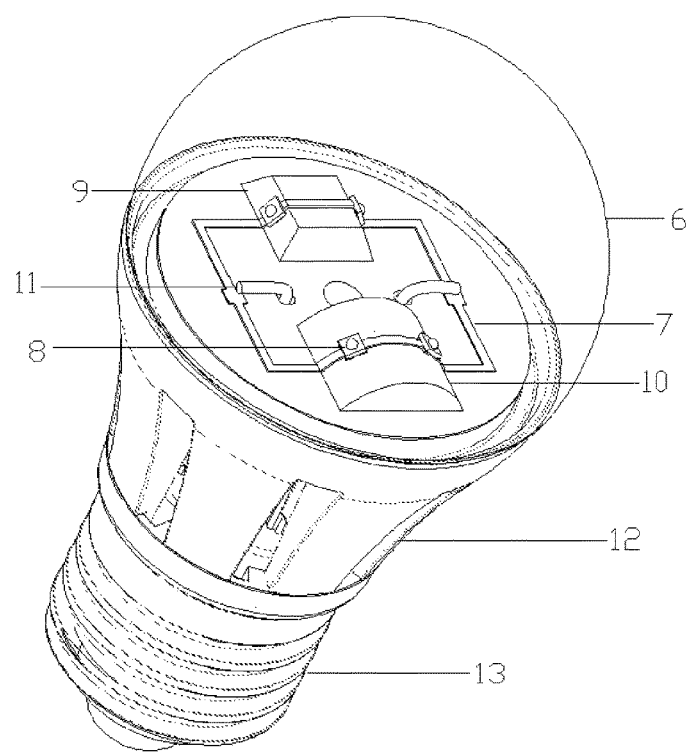
FIG. 4 is a structure diagram of embodiment 2 of an LED bulb lamp of the invention.

FIG. 4 shows the LED bulb lamp of the embodiment. The LED bulb lamp comprises a bulb 6, light-emitting chips 8, a second lamp base 12 and a lamp holder 13. Compared with a traditional bulb lamp, the LED bulb lamp omits the circuit board, and the circuit is directly laid on the second lamp base 12, and more importantly, the circuit appears on the second lamp base 12 in the form of a three-dimensional circuit. The advantages of omitting the circuit board are that the path for transferring the heat from the light-emitting chips 8 to the second lamp base 12 can be shortened, and thermal resistance can be greatly reduced, thereby improving the cooling efficiency of the lamp. The emergence of the three-dimensional circuit not only diversifies the shape of the second lamp base 12, but also can help the technical personnel to control the arrangement positions and angles of the chips more reasonably, thereby achieving the light distribution requirements. When the three-dimensional circuit is manufactured on the bulb lamp, the process method of the invention is used; and the circuit layer is used for manufacturing the three-dimensional circuit on the second lamp base 12 through using a programmable equipment, manual coating or the combined mode of using the programmable equipment and manual coating.

From a structural point of view, the bulb 6 is located at an uppermost end of the lamp, wherein the bulb 6 is a transparent lamp shade. Four light-emitting chips 8 are located within the bulb 6; and pairwise welded to the second lamp base 12. The second lamp base 12 is a trumpet-shaped ceramic base, and has a three-dimensional structure on an upper surface thereof. The three-dimensional structure more specifically comprises a second boss 9 and an arched projection 10. In order to achieve the light distribution requirements, two light-emitting chips 8 are respectively arranged at two sides of the second boss 9, and another two light-emitting chips 8 are respectively arranged on two sliding slope surfaces of the arched projection 10. The upper surface of the second lamp base 12 is coated with the sintered three-dimensional circuit, wherein the three-dimensional circuit is more particularly a third conductive silver paste 7, i.e., the circuit layer coated on the surface of the second lamp base 12. The thickness of the third conductive silver paste 7 is above 20 µm, preferably 50 µm. At this thickness, the voltage applied to the third conductive silver paste 7 and the current passing through the third conductive silver paste 7 are in a normal range after the LED bulb lamp is powered on, are not likely to burn out the circuit, and can maintain the normal operation of the LED bulb lamp. The third conductive silver paste 7 partially covers surfaces of the second boss 9 and the arched projection 10, and positive and negative pins of the light-emitting chips 8 are all in contact with the third conductive silver paste 7 to ensure the electrical connection. The second lamp base 12 has two electrical holes and a central process hole; and an electrical cable 11 is connected with the third conductive silver paste 7, penetrates through the electrical holes and is connected to a driving device in the lamp holder 13, to complete the electrical circuits of the entire lamp.

Embodiment 3

The embodiment relates to the application of the preparation method for coating type three-dimensional circuit on an electronic device without circuit board.

Figure 5:
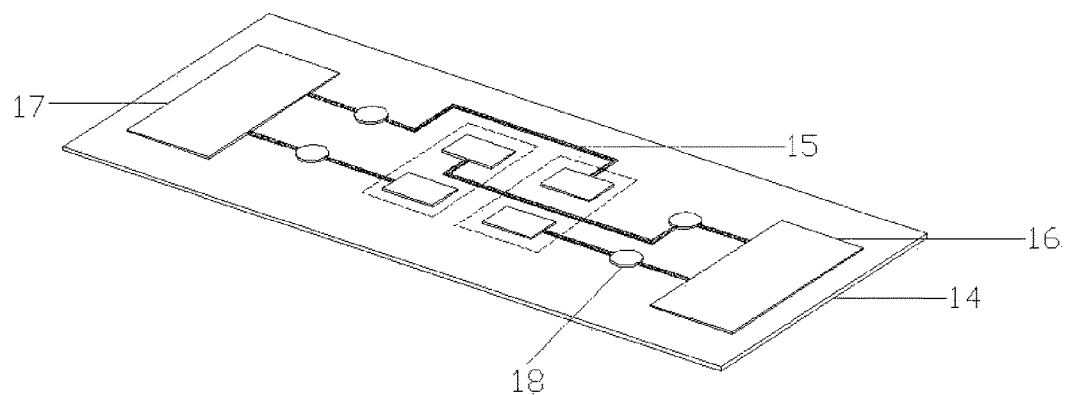
FIG. 5 is a schematic diagram of a circuit board manufactured by using the traditional process.

The structure diagram of the circuit board more common on the market and manufactured by the traditional process is shown in FIG. 5. It can be seen that the entire plate 14 has a flat plate structure, on which a first circuit layer 15 is laid. A first device 16 and a second device 17 are mounted at a predetermined position of the plate 14, fixed on the plate 14 by welding spots 18 and communicated with the first circuit layer 15, wherein the first circuit layer 15 is formed by etching away the excess copper through photoresist etching process and welding a layer of tin. While positions of the first circuit layer 15, the welding spots 18, the first device 16 and the second device 17 are photocopied or printed on the plate 14 by utilizing pre-drawn drawings. Finally, the first device 16 and the second device 17 are fixed on the plate 14 by the welding spots 18 and interconnected with the first circuit layer 15. Meanwhile, in the photocopying printing process, in order to clearly and accurately reflect the positions of the respective components and circuits on the plate 14, the plate 14 of the circuit board is required to be a two-dimensional panel with a flat surface and without any three-dimensional structure, thereby greatly limiting the operation freedom of people to design and manufacture the circuit boards. Moreover, in some special cases, the space occupied by the circuit board in the horizontal direction may be limited. The first device 16 and the second device 17 have some mutual influence on the electromagnetic and thermal aspects. A certain spaced distance is required to eliminate the influence, so that it brings challenges to the design of planar circuit.

Figure 6:
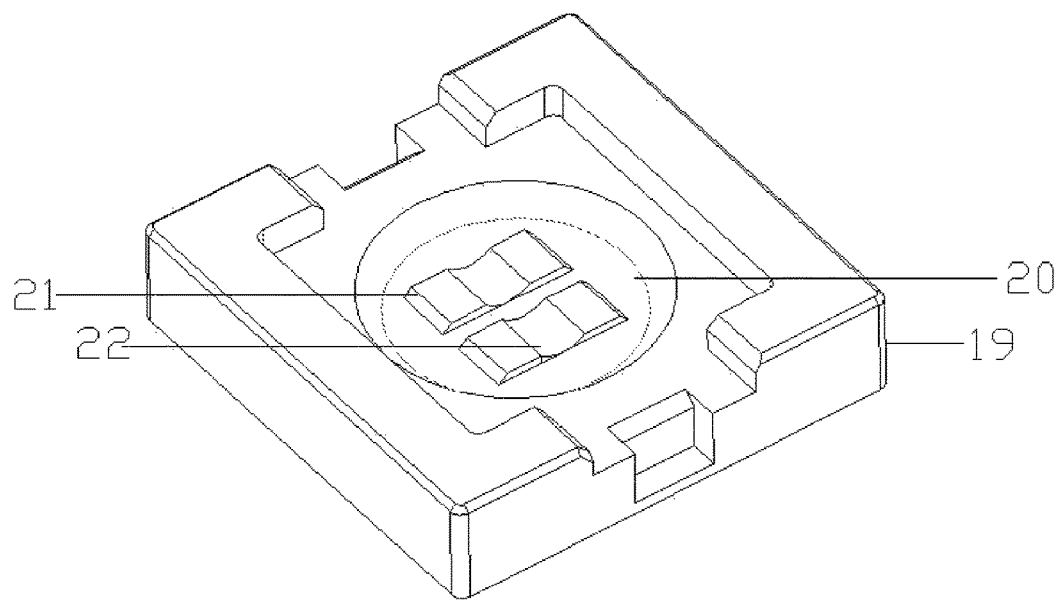
FIG. 6 is a schematic diagram showing that a substrate of an electronic device in Embodiment 3 has not been coated with a circuit layer.

The schematic diagram showing that the substrate of the electronic device of the embodiment has not been coated with the circuit layer is shown in FIG. 6. The substrate 19 is generally square and mainly made of ceramic. The substrate 19 has a relatively complicated structure and comprises multiple depressions. A circular groove 20 is formed in the center of the substrate 19, and the edge of the circular groove 20 has a certain slope. Meanwhile, two groups of third bosses 21 are located within the circular groove 20. The two groups of the third bosses 21 are connected with each other by an approximately semi-circular downwards arched structure 22. The circular groove 20, the third bosses 21 and the downwards arched structure 22 form a certain three-dimensional structure on the substrate 19. The substrate 19 as shown in the figure has not been coated with the circuit layer.

Figure 7:
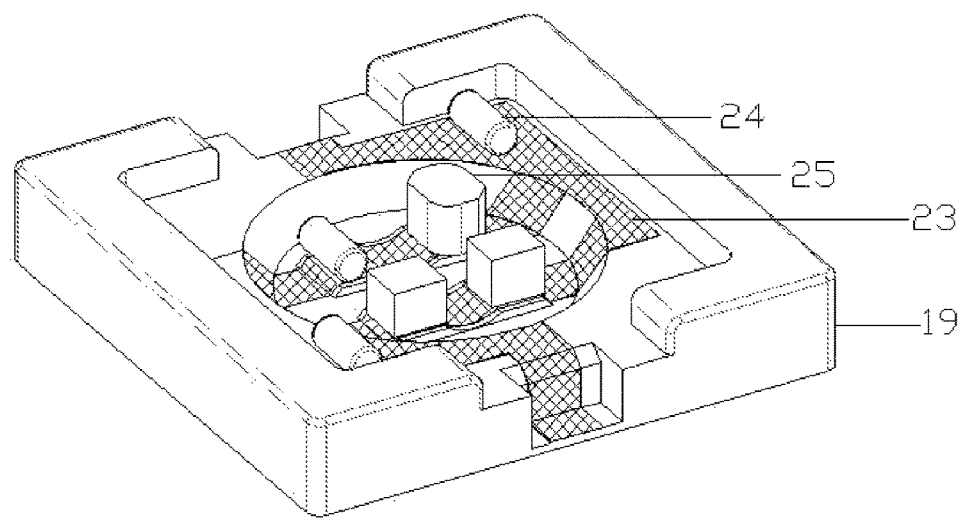
FIG. 7 is a schematic diagram showing that the substrate of the electronic device in Embodiment 3 has been coated with the circuit layer and installed with components.

FIG. 7 is a schematic diagram showing that the substrate of the electronic device in FIG. 6 has been coated with circuit layer and installed with component. The substrate 19 is coated with a second circuit layer 23 by using the process of this invention and the thickness of the second circuit layer 23 is 20 µm or above. In order to meet the normal operation of each electronic component in the substrate 19, preferably, the thickness of the coated circuit layer 23 is 40 µm. The first component 24, the second component 25 and other components are welded in corresponding positions of the substrate 19. The positive and negative pins of the first component 24 and the second component 25 are in contact with the second circuit layer 23. The first component 24 and second component 25 are selected from a group consisting of resistors, capacitors, inductors, triodes and integrated chips. There is certain electromagnetic interference between the first component 24 and the second component 25. A certain spaced distance is required to eliminate the electromagnetic interference. Since the second circuit layer 23 is coated on the surface of the substrate 19 having the three-dimensional structure, the substrate 19 has a three-dimensional circuit, which allows the first component 24 and the second component 25 to be in the same horizontal plane, and spaced at a certain distance, to make up the defect that the first component 24 and the second component 25 are not spaced sufficiently due to limited space of the substrate 19 in the horizontal direction. Additionally, the three-dimensional structure on the surface of the substrate 19 may be more complex and diverse, not just limited to boss, groove, etc. In this case, the three-dimensional circuit can still be formed by a coating circuit layer on the substrate, to completely get rid of the constraint of the circuit board on the circuit production and design.

Figure 8:
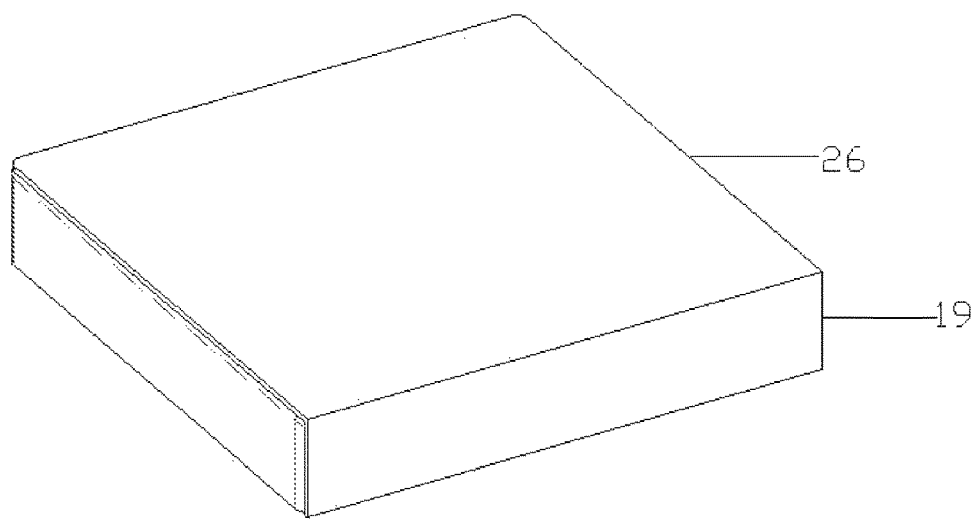
FIG. 8 is a schematic diagram of Embodiment 3.
Figures 1, 2:
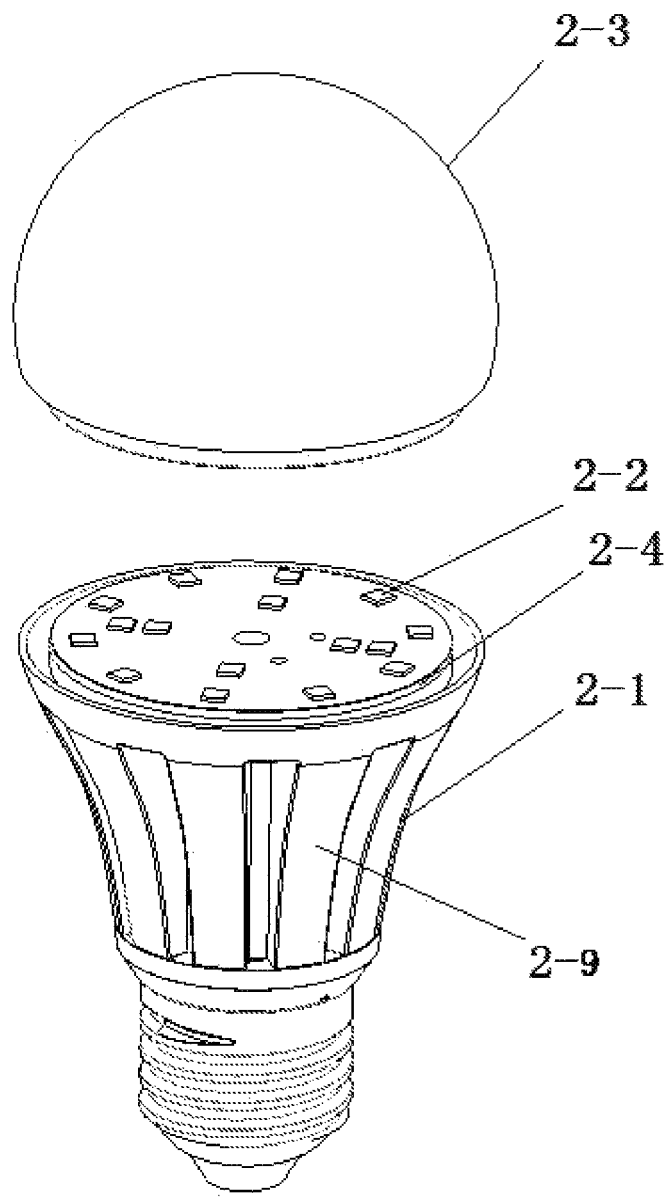
Figure 2:
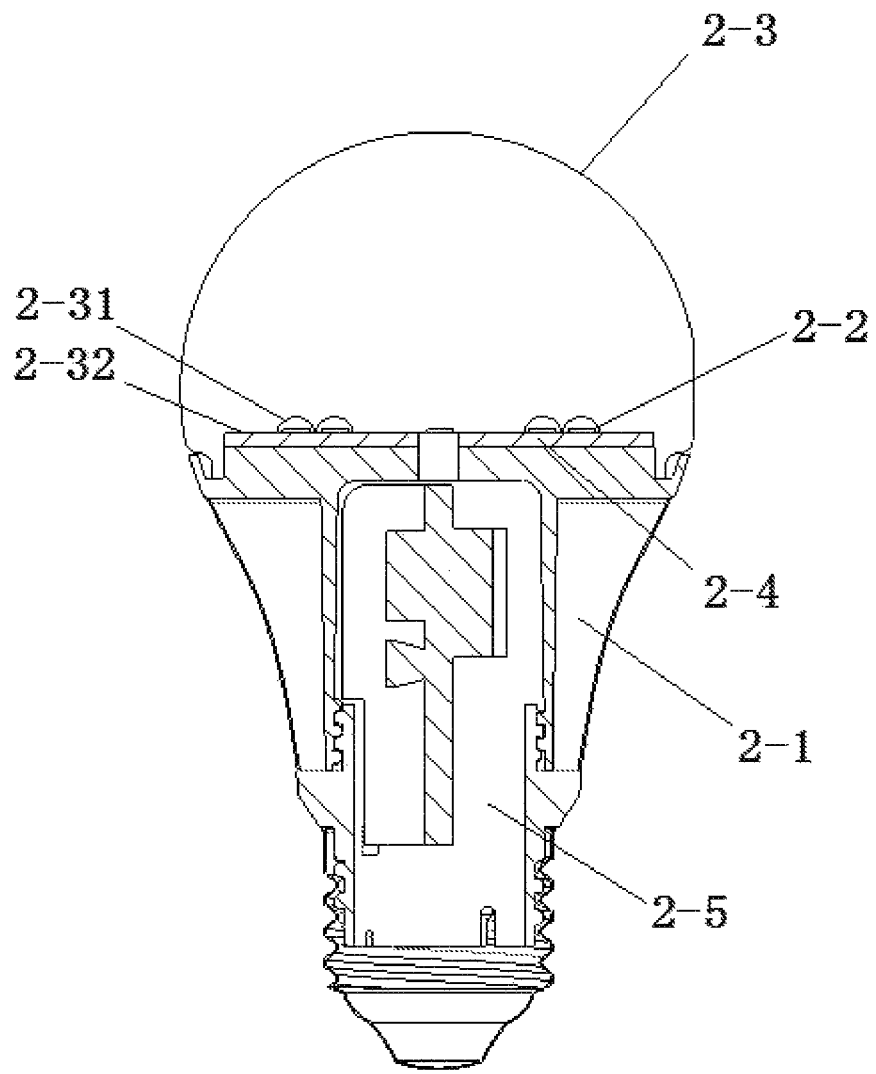
Figures 2, 3:
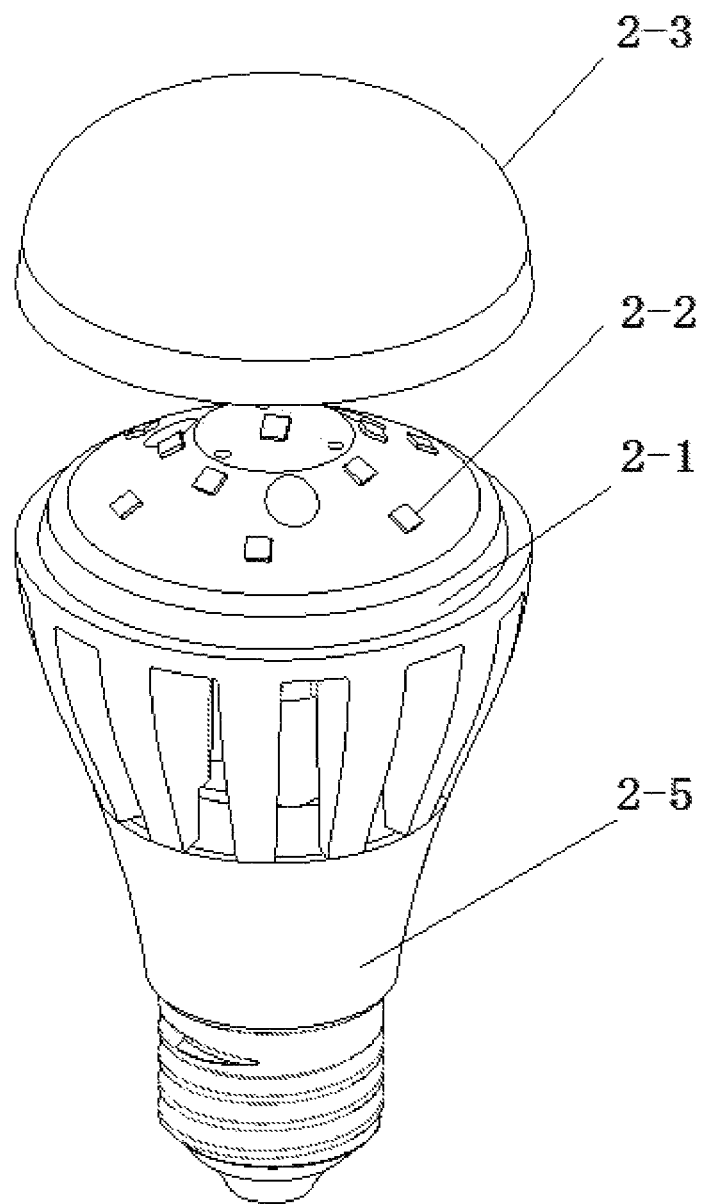
Figures 2, 3, 4:
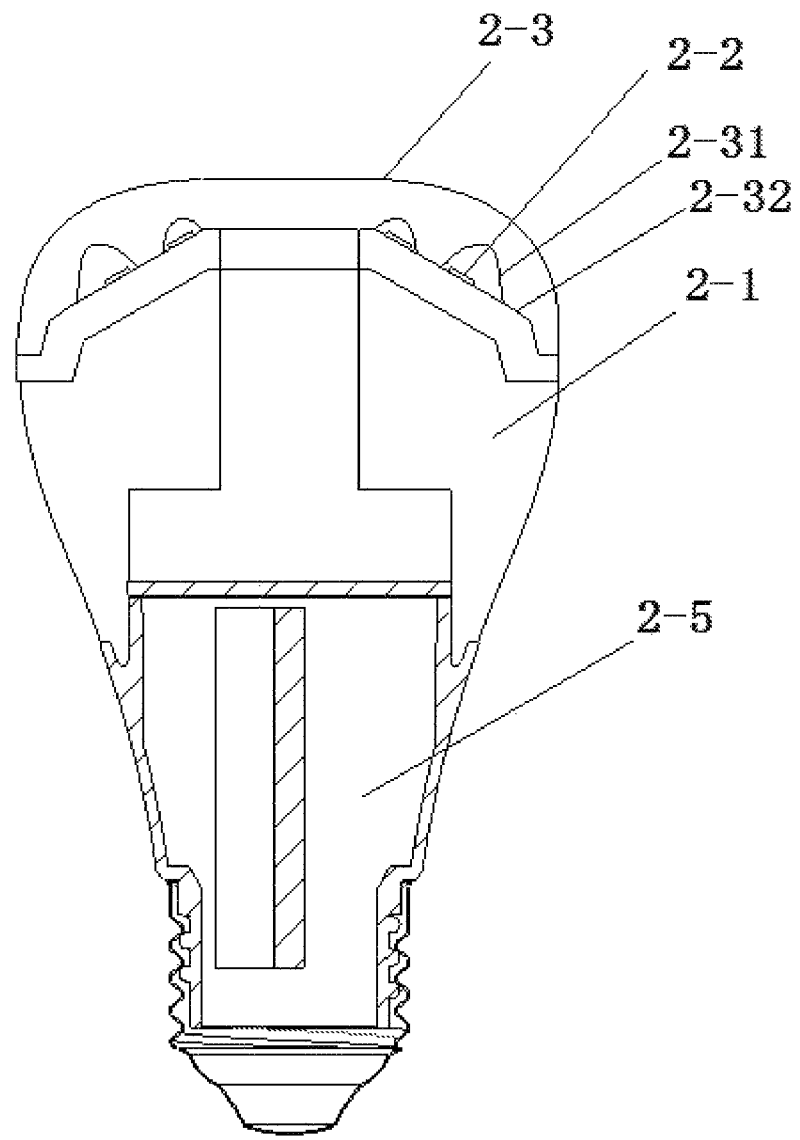
Figures 2, 3, 4, 5:
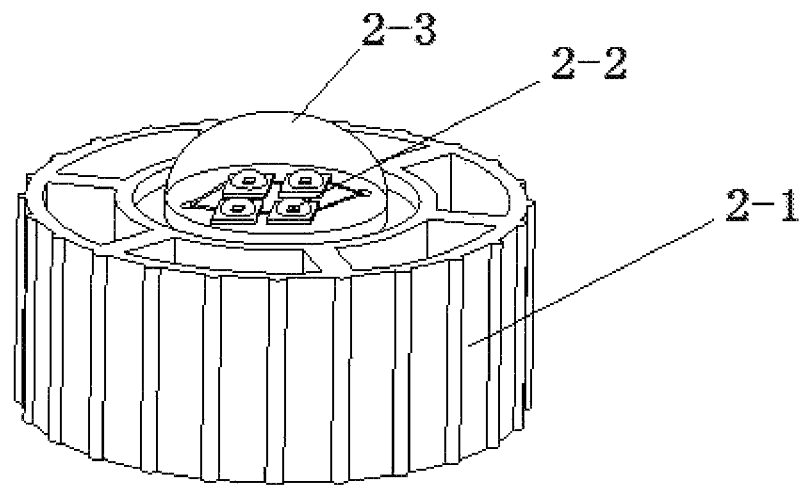
Figures 2, 3, 4, 5, 6:
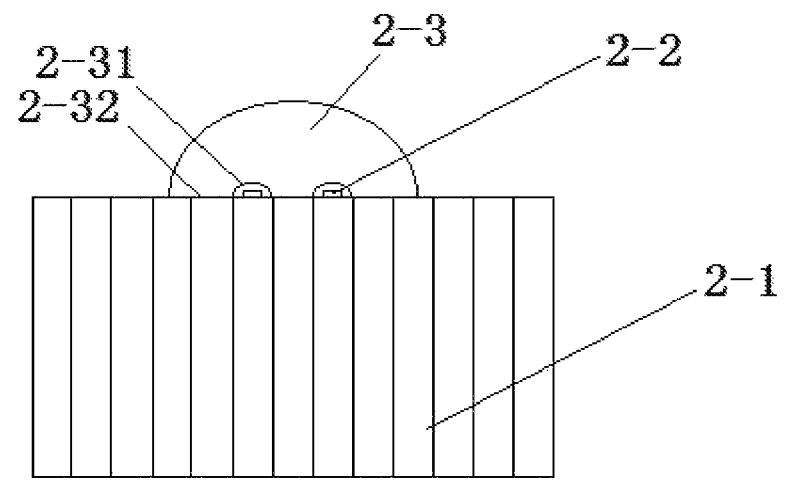
Figures 2, 3, 4, 5, 6, 7:
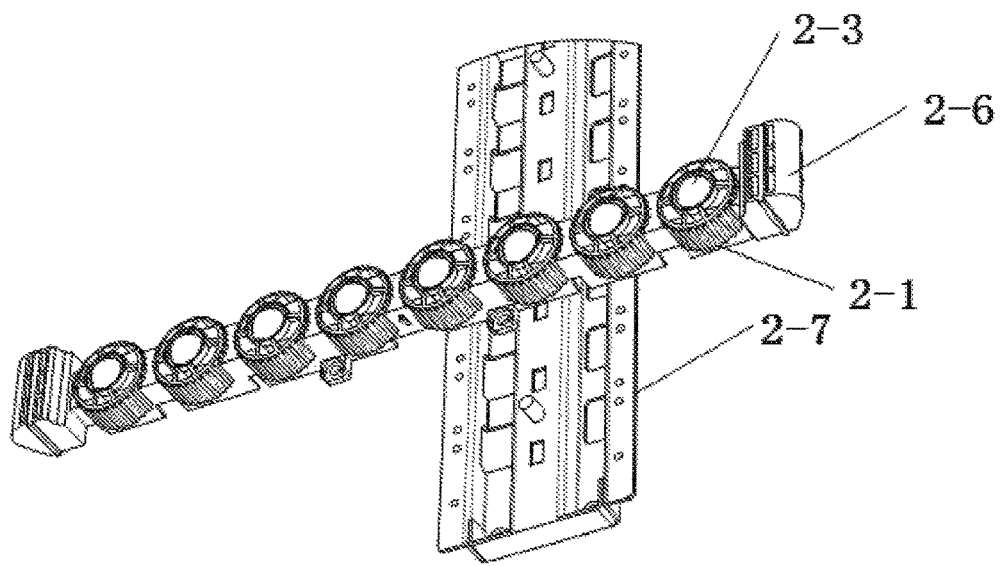
Figures 2, 3, 4, 5, 6, 7, 8:
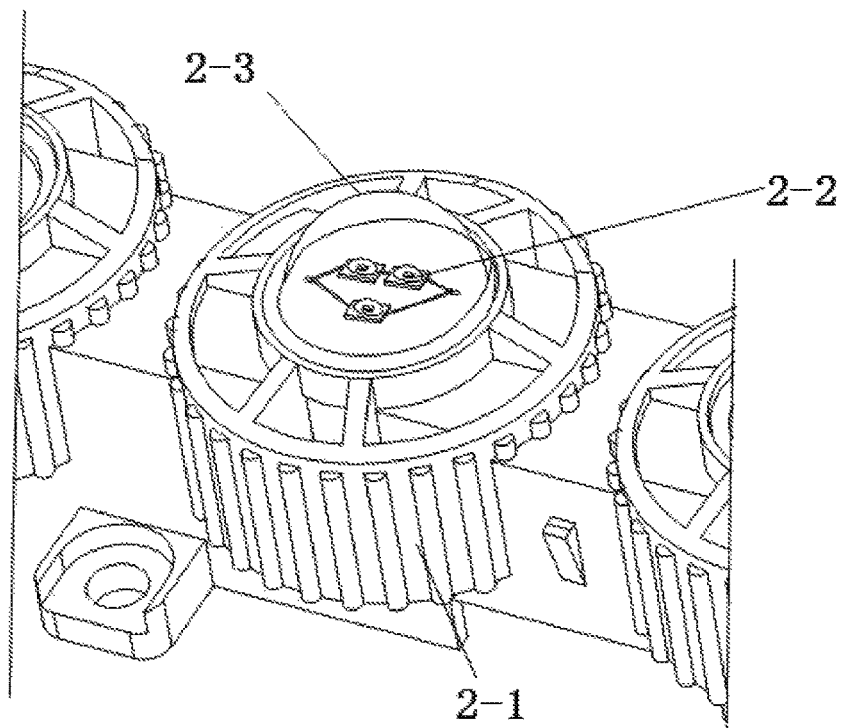
Figures 2, 3, 4, 5, 6, 7, 8, 9:
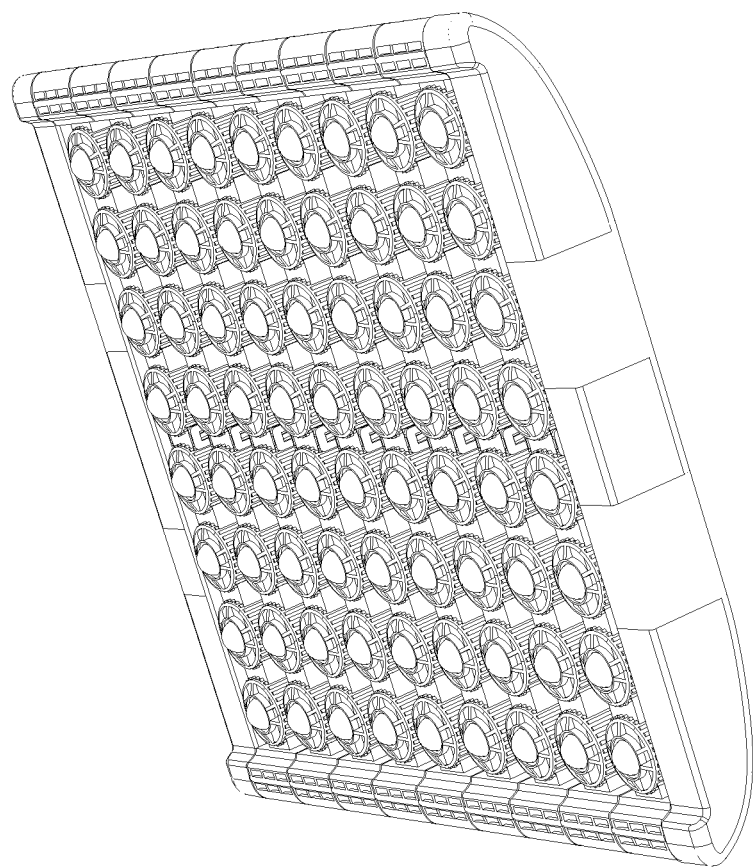
Figures 2, 3, 4, 5, 6, 7, 8, 9, 10:
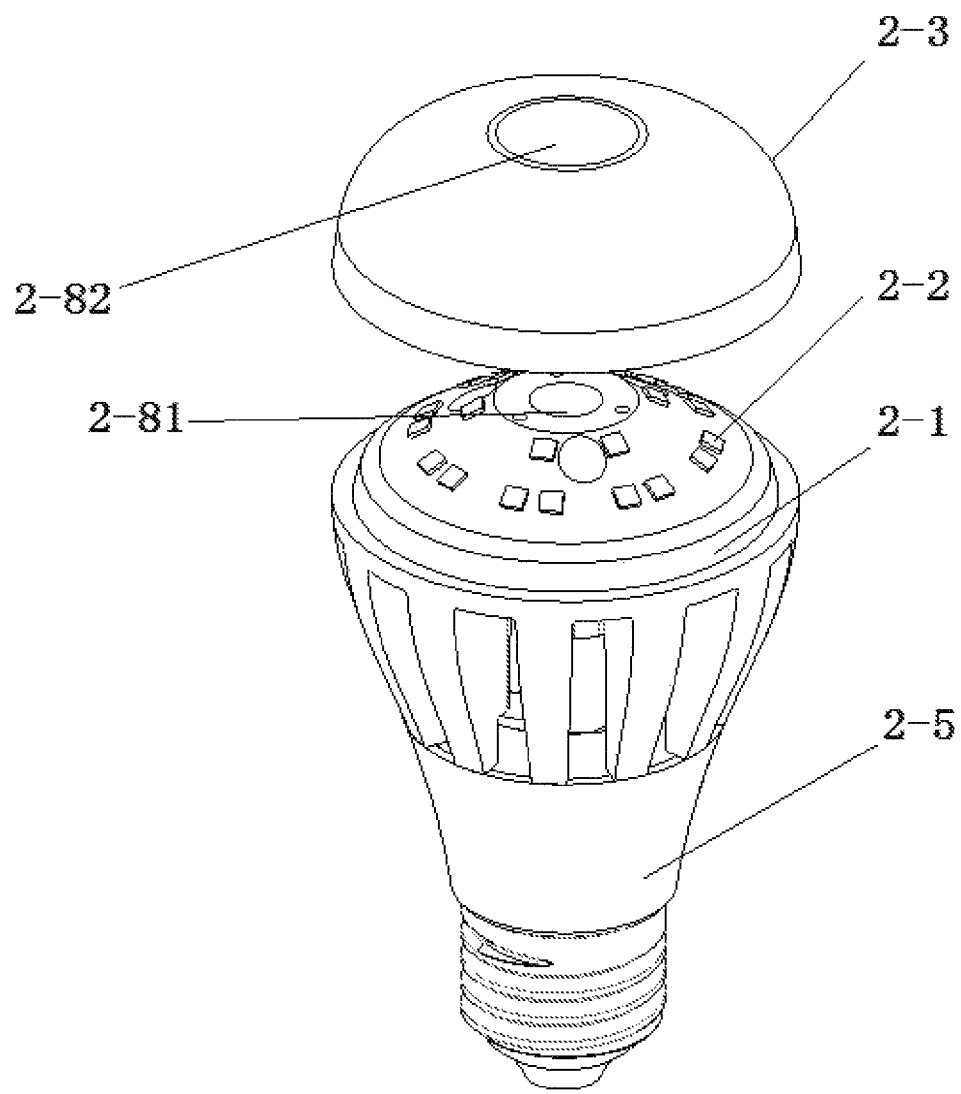
Figures 2, 3, 4, 5, 6, 7, 8, 9, 10, 11:
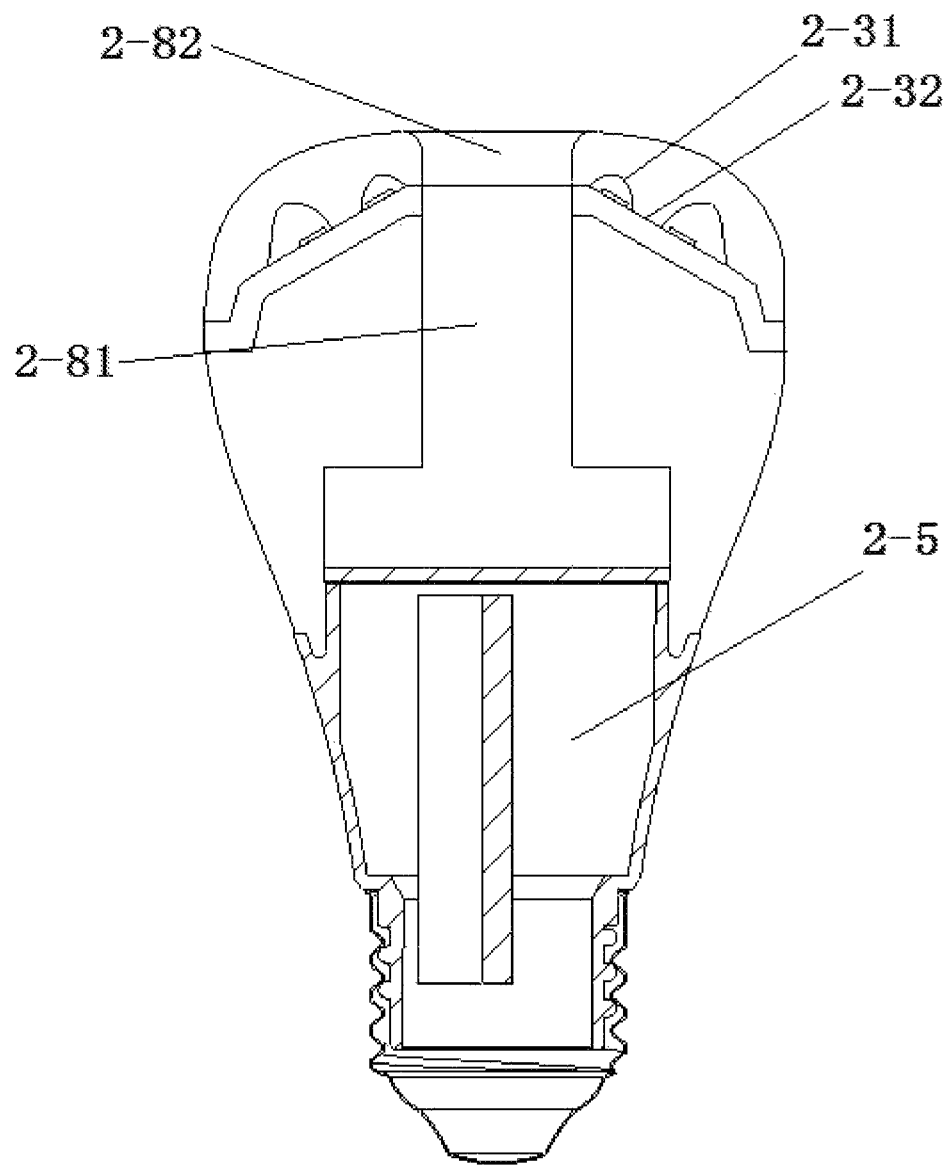
Figures 2, 3, 4, 5, 6, 7, 8, 9, 10, 11, 12:
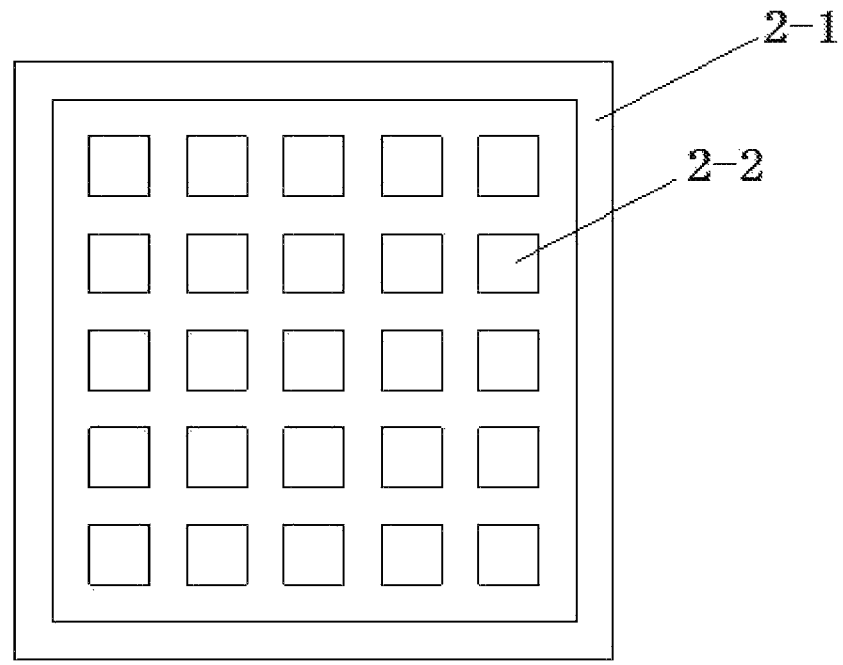
Figures 2, 3, 4, 5, 6, 7, 8, 9, 10, 11, 12, 13:
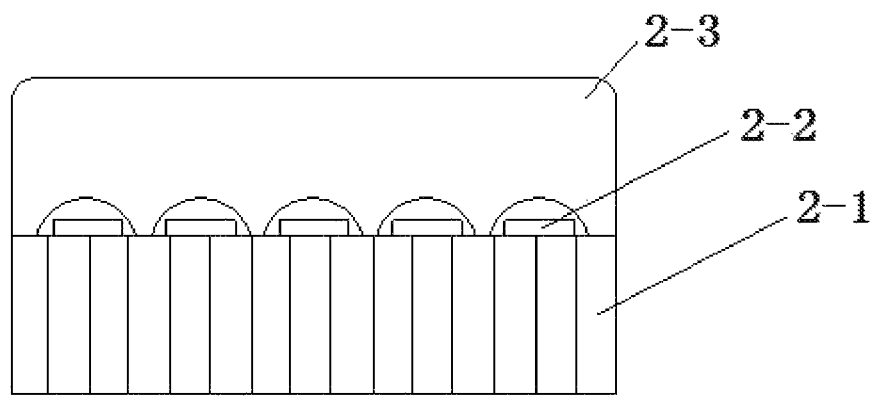
Figures 2, 3, 4, 5, 6, 7, 8, 9, 10, 11, 12, 13, 14:
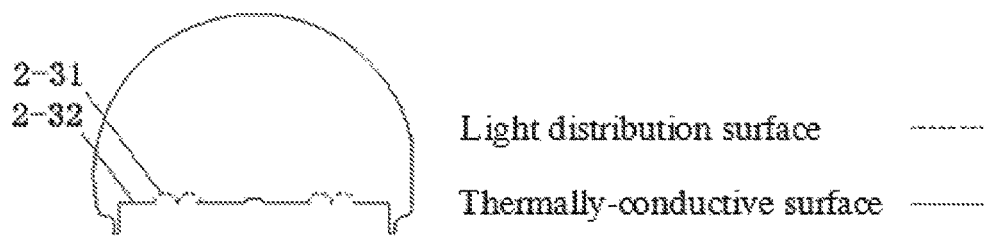
Figures 2, 3, 4, 5, 6, 7, 8, 9, 10, 11, 12, 13, 14, 15:
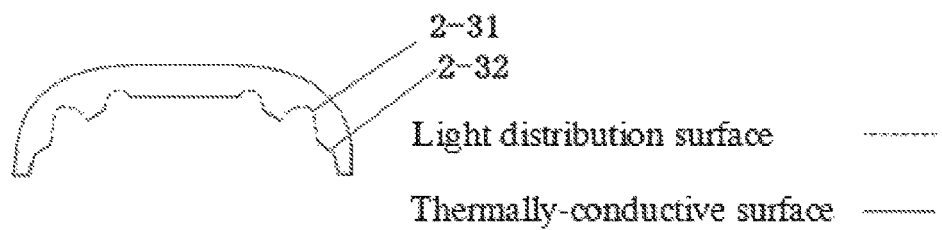
Figures 2, 3, 4, 5, 6, 7, 8, 9, 10, 11, 12, 13, 14, 15, 16:
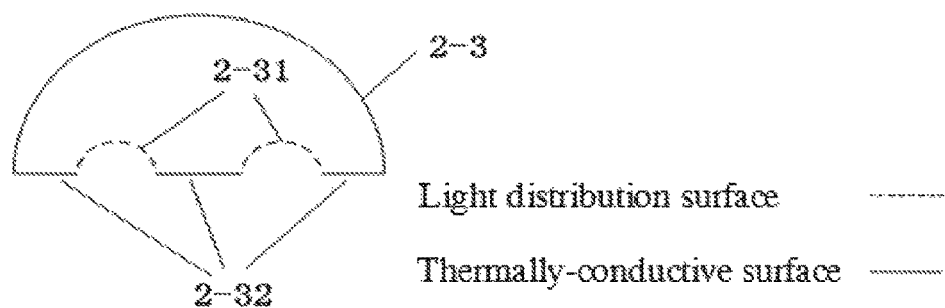
Figures 2, 3, 4, 5, 6, 7, 8, 9, 10, 11, 12, 13, 14, 15, 16, 17:
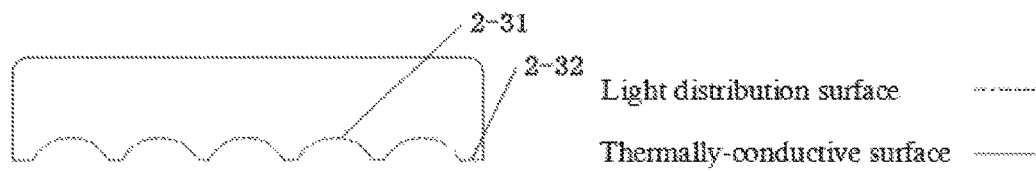
Figures 2, 3, 4, 5, 6, 7, 8, 9, 10, 11, 12, 13, 14, 15, 16, 17, 18:
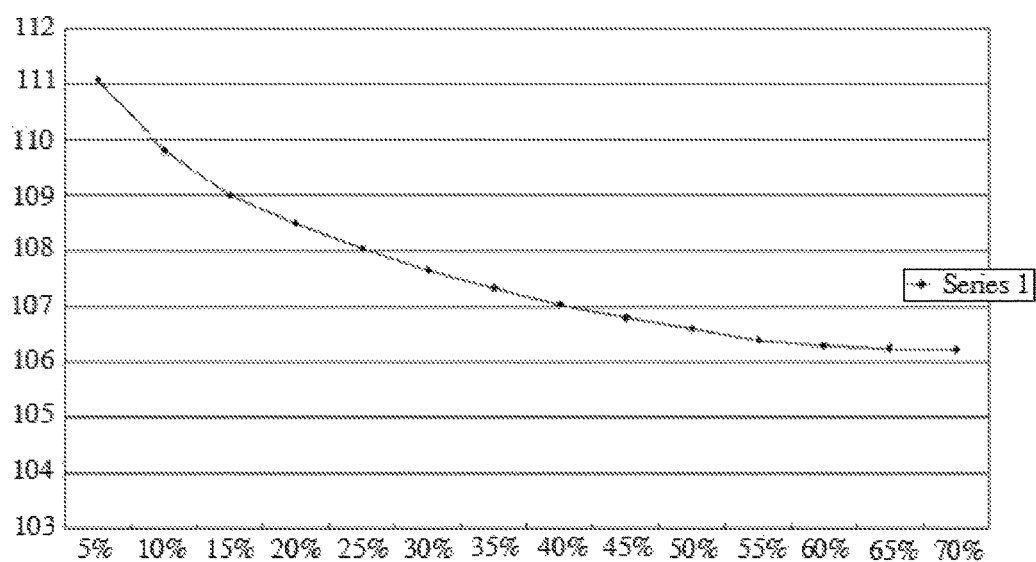
Figures 2, 3, 4, 5, 6, 7, 8, 9, 10, 11, 12, 13, 14, 15, 16, 17, 18, 19:
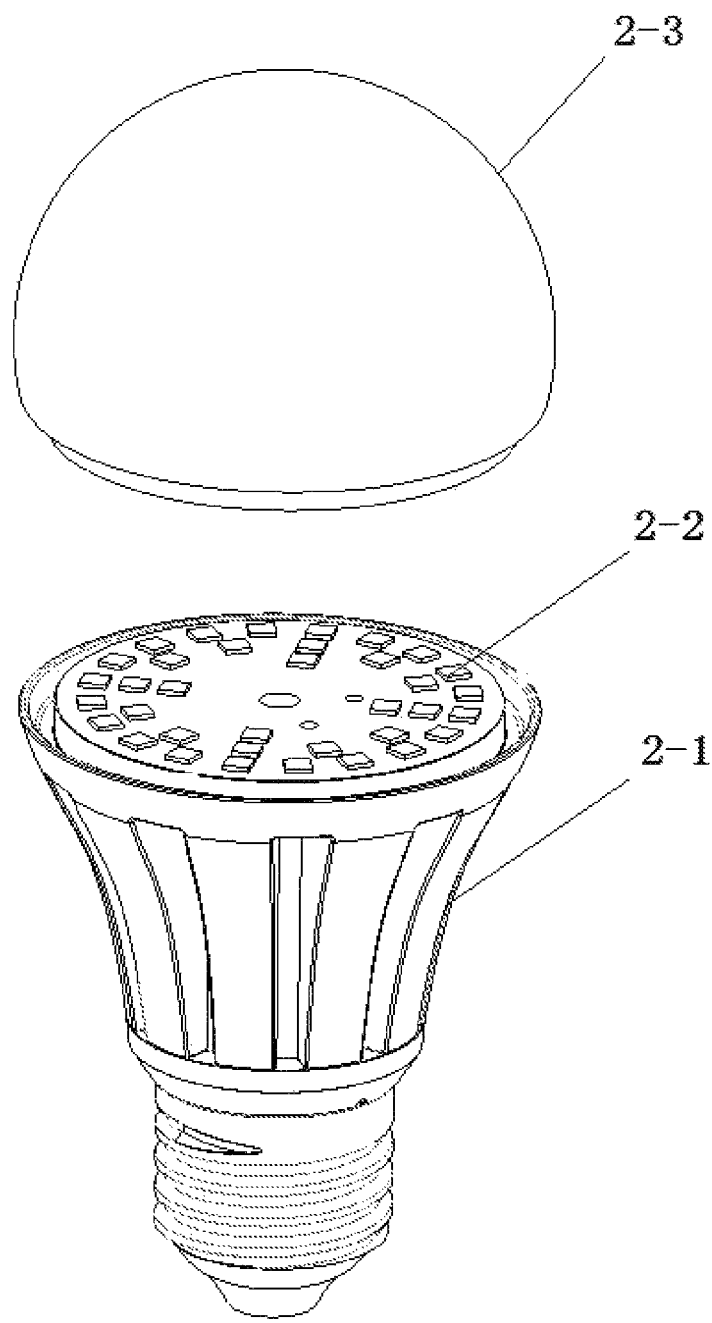
Figures 2, 3, 4, 5, 6, 7, 8, 9, 10, 11, 12, 13, 14, 15, 16, 17, 18, 19, 20:
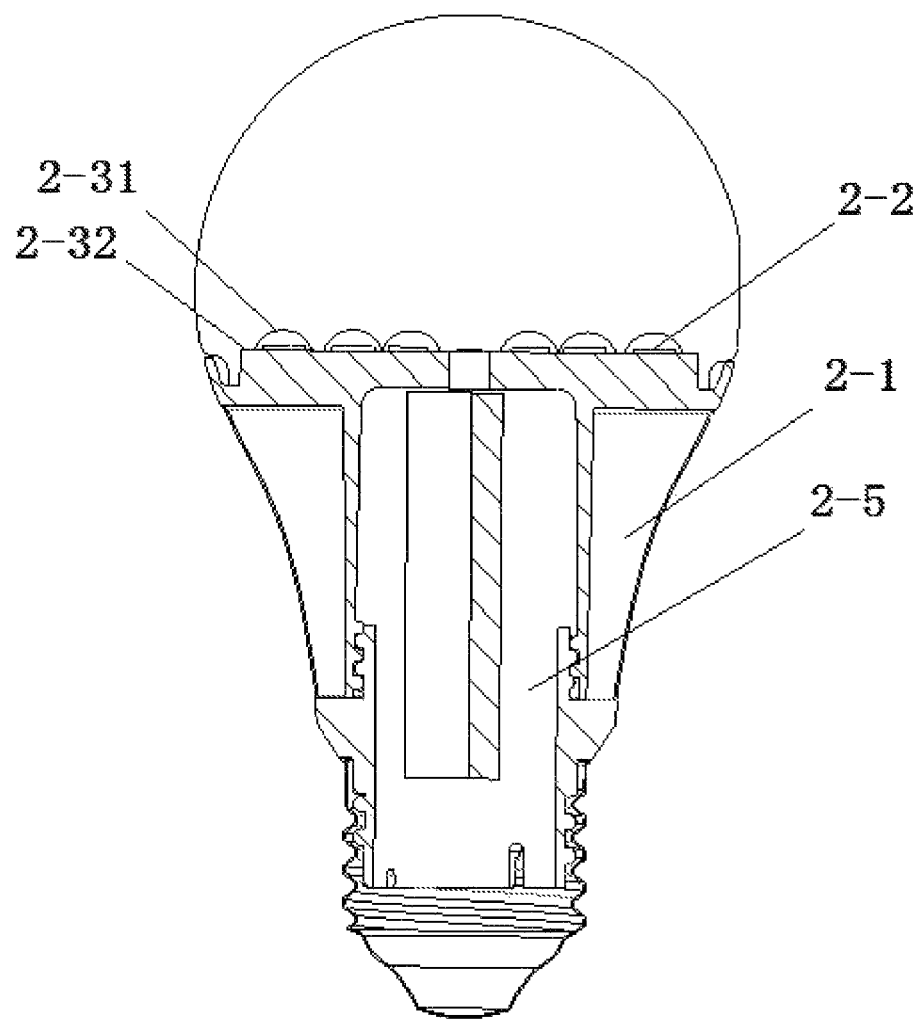

FIG. 8 is a schematic diagram of a preferred embodiment of the electronic device in the embodiment. The main structure of the electronic device comprises a substrate 19, an electronic component and an outer housing 26. The electronic device is not installed with circuit board and electrical function of the electronic device is achieved by directly manufacturing three-dimensional circuit on the surface of the substrate 19. After a three-dimensional circuit is formed on the surface of the substrate 19 and installed with electronic component, it is encapsulated by the outer housing 26, to compose a complete electronic device with a certain function.

In conclusion, the three-dimensional circuit is produced by the manufacturing method of the invention, so it is possible to get rid of the constraint that the circuit board must be a planar plate structure, and has very high feasibility. In addition, due to the simple process and non-pollution, the specific application of this technical solution can better meet the trend of low-carbon environment in the whole society.

An LED lighting device according to the invention comprises a base 2-1, an LED light-emitting unit, a lamp shade 2-3 and a power supply chamber 2-5. The lamp shade 2-3 is made of a thermally-conductive and transparent solid material with good heat conduction. The LED light-emitting chips of the LED light-emitting unit are fixed to the base 2-1. The lamp shade 2-3 is disposed on the base 2-1 and directly contacts with the base 2-1, to cover the LED light-emitting unit. The thermally-conductive surface 2-32 on the inner surface of the lamp shade 2-3 closely fits with the upper surface of the base 2-1, to compose a heat flow path and achieve the heat dissipation function. The inner surface of the corresponding area of the lamp shade 2-3 and the LED light-emitting chips 2-2 forms a specific shape of space structure according to the design needs, to change the light intensity distribution. The inner surface of the corresponding area of the lamp shade 2-3 and the LED light-emitting unit or the LED light-emitting chips, namely the light distribution surface, together with the upper surface of the base, forms a light distribution chamber accommodating the LED light-emitting unit. The thermally-conductive surface 2-32 is regarded as a part of the inner surface of the lamp shade 2-3, and the thermally-conductive surface 2-32 itself can participate in light distribution by using light reflection and/or refraction. Therefore, technical solutions using the thermally-conductive surface 2-32 to participate in light distribution also belong to the non-limiting embodiments protected by the invention.

The upper surface of the base 2-1 is flat, curved, or in a shape of multi-planar combination. The base 2-1 can employ a hollow structure to increase air circulation and enhance heat dissipation, for example, a first cooling hole 2-81 is arranged in the middle of the base 2-1, to increase air circulation and enhance heat dissipation. Correspondingly, a second cooling hole 2-82 is arranged in the corresponding position of the lamp shade 2-3 and the base 2-1. The number of LED light-emitting chips is one or more.

The lamp shade 2-3 has a light distribution function, and is made of ceramic, glass or other highly thermally-conductive materials with light transmission performance. The outer surface of the lamp shade 2-3 is designed into a specific shape according to the actual needs. The base 2-1 is arranged on the power supply chamber 2-5, to realize independent heat dissipation respectively. The base 2-1 can be a metal base coated with an insulating layer, a ceramic base, etc.

Embodiment 4

Next, Embodiment 4 will be described in detail with reference to FIG. 2-1 and FIG. 2-2.

The LED lighting device is an LED bulb lamp. The LED bulb lamp mainly comprises a base 2-1, sixteen LED light-emitting chips 2-2, a circuit board 2-4, a lamp shade 2-3 and a power supply chamber 2-5. The base 2-1 is an aluminum base coated with an insulating layer and with a planar upper surface. The circuit board 2-4 is located on the aluminum base and the sixteen LED light-emitting chips 2-2 are arranged on the circuit board 2-4. The lamp shade 2-3 is a solid transparent glass. The lamp shade 2-3 directly contacts with the base 2-1 and covers the base 2-1 to package the LED light-emitting chips and the circuit board inside. The light distribution surface 2-31 is arranged on the inner surface corresponding to the LED light-emitting chips 2-2, but not adhered to the LED light-emitting chips 2-2, so as to form a light distribution chamber together with the upper surface of the base. The thermally-conductive surface 2-32 is distributed in the central region and the edge region of the inner surface and completely fits with the upper surface of the base 2-1, to achieve light transmission and heat dissipation. The base 2-1 has a non-hollow structure. Cooling fins 2-9 are arranged on the outer surface of the base 2-1 to increase the cooling area. An electrical hole for passing through a wire is formed on the base. One end of the wire is connected to the circuit board, and the other end thereof is connected to the power supply in the power supply chamber 2-5 by passing through the electrical hole. The power supply chamber 2-5 and the base are integrally formed. The cavity of the power supply chamber is not communicated with the base 2-1, to realize independent heat dissipation. Or, the power supply chamber 2-5 is made of plastic as an independent structure, and not communicated with the base 2-1. The base 2-1 is connected with the power supply chamber in a screwing mode.

Embodiment 5

Next, Embodiment 5 will be described in detail with reference to FIG. 2-3 and FIG. 2-4.

The LED lighting device may be an LED bulb lamp. The LED bulb lamp mainly comprises a base 2-1, twelve LED light-emitting chips 2-2, a circuit coating, a lamp shade 2-3 and a power supply chamber 2-5. The base 2-1 is a ceramic base 2-1 with a curved upper surface, and the shape of the base is shown in FIG. 2-3 and FIG. 2-4. The circuit coating is a conductive silver paste, which is directly coated on the upper surface of the base. The LED light-emitting chips are arranged on a convex curved surface on the upper surface of the base 2-1. The upper surface of the base 2-1 is directly coated with the circuit coating to connect all chips with the power supply, and the electrode pins of the light-emitting chips are electrically connected with the circuit coating. The circuit coating material is a conductive silver paste. The lamp shade 2-3 is a solid transparent ceramic, which is made of PLZT. The lamp shade 2-3 directly contacts and engages with the base 2-1, and covers the base 2-1 to package the LED light-emitting chips 2-2 and the circuit coating inside. The light distribution surface 2-31 is arranged on the inner surface corresponding to the LED light-emitting chips 2-2, but not adhered to the LED light-emitting chips 2-2, so as to form a light distribution chamber together with the upper surface of the base. The thermally-conductive surface 2-32 is distributed in the central region and the edge region of the inner surface and completely fits with the upper surface of the base 2-1, to achieve light transmission and heat dissipation. The power supply chamber 2-5 has an independent structure, which is not communicated with the base 2-1. The base 2-1 is connected with a housing of the power supply chamber 2-5 in socket manner, to realize independent heat dissipation respectively. Preferably, the base 2-1 has a completely hollow structure to achieve cross ventilation.

Embodiment 6

Next, Embodiment 6 will be described in detail with reference to FIG. 2-5 and FIG. 2-6.

The LED lighting device may be a unitized LED lighting device. Each LED lighting device is regarded as an LED light-emitting unit in the entire lighting system. Each LED light-emitting unit mainly comprises a base 2-1, four LED light-emitting chips 2-2 and a lamp shade 2-3. The base 2-1 is an aluminum base coated with an insulating material. A circuit board 2-4 is installed on the base 2-1 and the LED light-emitting chips 2-2 are arranged on the circuit board 2-4. The lamp shade 2-3 is a solid transparent ceramic, which is made of polycrystalline AlON. The lamp shade 2-3 directly contacts with the base 2-1 and covers the base 2-1 to package the LED light-emitting chips 2-2 and the circuit board 2-4 inside. The light distribution surface 2-31 is arranged on the inner surface corresponding to the LED light-emitting chips 2-2, but not adhered to the LED light-emitting chips 2-2, so as to form a light distribution chamber together with the upper surface of the base. The thermally-conductive surface 2-32 is distributed in the central region and the edge region of the inner surface and completely fits with the upper surface of the base 2-1, to achieve light transmission and heat dissipation. The base 2-1 has a non-hollow structure. Cooling fins 2-9 are arranged on an outer surface of the base 2-1 to increase the cooling area. A plurality of LED light-emitting units can be combined to form a lighting system.

Embodiment 7

Next, Embodiment 7 will be described in detail with reference to FIG. 2-7, FIG. 2-8 and FIG. 2-9.

The LED lighting device may be a modular LED lighting device, which is mainly comprises a light-emitting module 2-6 and a framework 2-7. The modular LED lighting device comprises one base 2-1, twenty four LED light-emitting chips 2-2 and eight lamp shades 2-3. The base 2-1 is an aluminum base coated with an insulating material. A circuit coating is coated on the insulating material. The twenty four LED light-emitting chips 2-2, in groups of three, are arranged on the base 2-1 coated with the insulating material, and connected with each other through the circuit coating. The circuit coating is a conductive copper paste. The eight lamp shades 3 are the solid transparent ceramics, which are made of YAG. The outer surface of every lamp shade is hemispherical and covers the base 2-1. Each lamp shade 2-3 packages three corresponding LED light-emitting chips 2-2 inside. The light distribution surface 2-31 is arranged on the inner surface corresponding to the LED light-emitting chips 2-2, but not adhered to the LED light-emitting chips 2-2, so as to form a light distribution chamber together with the upper surface of the base. The thermally-conductive surface 2-32 is distributed in the central region and the edge region of the inner surface and completely fits with the upper surface of the base 2-1, to achieve light transmission and heat dissipation. The base 2-1 has a non-hollow structure. Cooling fins 2-9 are arranged on the outer surface of the base 2-1 to increase the cooling area. Nine light-emitting modules 2-6 are connected to the framework 2-7 to form a complete modular LED lighting system, as shown in FIG. 2-10.

Embodiment 8

Next, Embodiment 8 will be described in detail with reference to FIG. 2-10 and FIG. 2-11.

The LED lighting device may be an LED bulb lamp. The LED bulb lamp mainly comprises a base 2-1, twelve LED light-emitting chips and a highly thermally-conductive lamp shade 2-3. The base 2-1 is a ceramic base 2-1 with a curved upper surface, and the shape of the base is shown in FIG. 2-9 and FIG. 2-10. The base 2-1 is coated with a circuit coating; the circuit coating is conductive silver-palladium alloy slurry. A first cooling hole 2-81 is arranged in the middle of the base 2-1. The LED light-emitting chips 2-2 are disposed on the upper surface of the base 2-1 except for the cooling hole, and connected with each other through the circuit coating. The lamp shade 2-3 is a solid transparent ceramic, which is made of MgAl$_2$O$_4$. A second cooling hole 2-82 in the same size is arranged in the middle position corresponding to the first cooling hole 2-81 of the base 2-1, to achieve air circulation. The inner surface of the lamp shade 2-3 in contact with the base 2-1 is a curved surface corresponding to the shape of the base 2-1. The lamp shade 2-3 directly contacts with the base 2-1, and covers the base 2-1 to package the LED light-emitting chips 2-2 and the circuit coating inside. The light distribution surface 2-31 is arranged on the inner surface corresponding to the LED light-emitting chips 2-2, but not adhered to the LED light-emitting chips 2-2, so as to form a light distribution chamber together with the upper surface of the base. The thermally-conductive surface 2-32 is distributed in the central region and the edge region of the inner surface and completely fits with the upper surface of the base 2-1, to achieve light transmission and heat dissipation. The base 2-1 has a completely hollow structure to achieve cross ventilation. The housing of power supply chamber 2-5 is not communicated with the base 2-1. The base 2-1 is connected with a housing of the power supply chamber 2-5 in screwing mode, to realize independent heat dissipation respectively.

Embodiment 9

Next, Embodiment 9 will be described in detail with reference to FIG. 2-12 and FIG. 2-13.

The LED lighting device comprises a base 2-1, two to twenty five LED light-emitting chips 2-2 and a lamp shade 2-3. The base 2-1 is a square ceramic base 2-1. A circuit board 2-4 is arranged on the base 2-1. The LED light-emitting chips 2-2 are arranged on the circuit board 2-4. The lamp shade 2-3 is a solid transparent ceramic. The transparent ceramic is a square corresponding to the base 2-1 and covers the base 2-1, to package all LED light-emitting chips 2-2 and the circuit board 2-4 inside. The light distribution surface 2-31 is arranged on the inner surface corresponding to the LED light-emitting chips 2-2, but not adhered to the LED light-emitting chips 2-2, so as to form a light distribution chamber together with the upper surface of the base. The thermally-conductive surface 2-32 is distributed in the central region and the edge region of the inner surface and completely fits with the upper surface of the base 2-1, to achieve light transmission and heat dissipation.

Embodiment 10

Next, Embodiment 10 will be described in detail with reference to FIG. 2-19 and FIG. 2-20.

The LED lighting device may be an LED bulb lamp. The LED bulb lamp mainly comprises a base 2-1, thirty six LED light-emitting chips 2-2, a circuit board, a highly thermally-conductive lamp shade and a power supply chamber. The base is a ceramic base with a planar upper surface; the circuit board is disposed on the base, and the LED light-emitting chips are disposed on the circuit board. The lamp shade is solid transparent plastic. The lamp shade directly contacts with the base, and covers the LED light-emitting chips and the circuit board. The light distribution surface and the upper surface of the base form a light distribution chamber accommodating the LED light-emitting unit. The thermally-conductive surface is distributed in the central region and the edge region of the inner surface, and closely fits with the upper surface of the base, to compose a heat flow path. The thermally-conductive surface covers 10%, 40% or 55% of the projected area of the entire inner surface. The base has a non-hollow structure. Cooling fins are arranged on an outer surface of the base. An electrical hole for passing through the wire is formed on the base. One end of the wire is connected to the circuit board, and the other end thereof is connected to the power supply in the power supply chamber by passing through the electrical hole. The power supply chamber is made of ceramic. The power supply chamber is fixedly connected with the base, and not communicated with the base, to realize independent heat dissipation respectively.

The above-mentioned Embodiment 5 to Embodiment 10 can be regarded as the changed embodiments and preferred embodiments of Embodiment 4, and can be regarded as the changed embodiment and preferred embodiment of each other.

The above specific embodiments and examples only aim to facilitate description of the invention but not to limit it; in case of not separating from the spirit of the invention, a variety of simple deformations and modifications made by technicians familiar with the industry shall still fall within the scope of patent protection of the invention.

What is claimed is:

1. An LED (light emitting diode) lighting device, comprising: a base, an LED light-emitting unit and a lamp shade, wherein:

the LED light-emitting unit is arranged on an upper surface of the base; the lamp shade contacts with the base directly, and covers the LED light-emitting unit; the LED light-emitting unit comprises a plurality of LED light-emitting chips and a circuit coating; the circuit coating is directly coated on the upper surface of the base; the LED light-emitting chips are directly disposed on the upper surface of the base, and electrode pins of the light-emitting chips are electrically connected with the circuit coating;

the lamp shade has an outer surface and an inner surface; the outer surface is a light exit surface; the inner surface consists of a light distribution surface and a thermally-conductive surface, wherein the light distribution surface is arranged on an inner surface region corresponding to the LED light-emitting chips; a gap is formed between the light distribution surface and the LED light-emitting chips, to form a light distribution chamber together with the upper surface of the base; the thermally-conductive surface is arranged on an inner surface part other than a part where the LED light-emitting chips are installed on the base, or an inner surface region corresponding to the entire upper surface, and closely fits with the base; and the thermally-conductive surface is at least distributed in a central region and an edge region of the inner surface;

the central region covers 10-55% of a projected area of the entire inner surface;

the lamp shade is made of transparent ceramic or glass.

2. The LED lighting device according to claim 1, wherein the upper surface of the base is flat, curved, or in a shape of multi-planar combination;

the outer surface of the lamp shade is made into a curved shape in accordance with requirements of light distribution; the inner surface in contact with the base is a curved shape corresponding to the upper surface of the base;

the base has a first cooling hole;

the lamp shade has a second cooling hole, the second cooling hole is correspondingly communicated with the first cooling hole, the base has a hollow structure, the first cooling hole on the base is communicated with an outside air through a side of the base.

3. The LED lighting device according to claim 1, wherein the base is a metal base coated with an insulating layer, or a base made of an insulating material.

4. The LED lighting device according to claim 1, wherein the base has a non-hollow structure; cooling fins are arranged on an outer surface of the base.

5. The LED lighting device according to claim 1, further comprising a power supply chamber, wherein a cavity of the power supply chamber is isolated from the base; an outer housing of the power supply chamber is connected to the base in inserting, clamping and screwing modes, to realize independent cooling respectively.

* * * * *